United States Patent [19]

Sullivan et al.

[11] 4,399,513
[45] Aug. 16, 1983

[54] MACHINE MONITORING SYSTEM AND APPARATUS

[75] Inventors: John D. Sullivan, Columbus; Larry G. Moore, Orient; James K. Taylor, Columbus, all of Ohio

[73] Assignee: IRD Mechanalysis, Inc., Columbus, Ohio

[21] Appl. No.: 194,997

[22] Filed: Oct. 8, 1980

[51] Int. Cl.³ .............................................. G06F 15/20
[52] U.S. Cl. .................................. 364/551; 364/508; 364/431.04; 364/518; 340/753
[58] Field of Search ................... 364/551, 550, 431.04, 364/433, 508, 424, 518; 340/753, 27 R; 73/117.3; 455/159

[56] References Cited

U.S. PATENT DOCUMENTS

| | | | |
|---|---|---|---|
| 3,906,437 | 9/1975 | Brandwein et al. | 364/424 X |
| 4,001,807 | 1/1977 | Dallimonti | 364/518 X |
| 4,109,312 | 8/1978 | Beutel | 364/550 X |
| 4,155,084 | 5/1979 | Klees | 340/753 |
| 4,163,387 | 8/1979 | Schroeder | 364/433 X |
| 4,242,980 | 1/1981 | Go | 340/753 X |
| 4,277,785 | 7/1981 | Schotz et al. | 340/753 |
| 4,286,265 | 8/1981 | Kauffman et al. | 340/753 X |
| 4,295,136 | 10/1981 | Stoutenburg | 364/753 |
| 4,296,409 | 10/1981 | Whitaker et al. | 364/424 X |

FOREIGN PATENT DOCUMENTS

| | | |
|---|---|---|
| 975033 | 11/1964 | United Kingdom . |
| 1453709 | 10/1976 | United Kingdom . |
| 1501931 | 2/1978 | United Kingdom . |
| 1538562 | 1/1979 | United Kingdom . |

*Primary Examiner*—Edward J. Wise
*Attorney, Agent, or Firm*—Mueller & Smith

[57] ABSTRACT

System and apparatus for monitoring vibrational and other detected aspects of a machine. Transducer outputs are scanned through the use of a microprocessor, the memory components of which retain pre-determined set point information. The channel representing a given transducer output is displayed visually on the apparatus for 5 second intervals in combination with a linear form of disply showing monitored transducer values as well as set point values. In the event of detected threshhold level warnings or the like, additional visual indicators representing both system and channel status conditions are energized. The system includes a small, hand-held programmer by which any of a broad variety of functions may be readily entered into the memory of the processor through the simple manipulation of a single potentiometer. During the programming procedure, the values being inserted are displayed on the noted bar chart. Preferably, the chart is present as a linear array of 50 LEDs.

34 Claims, 21 Drawing Figures

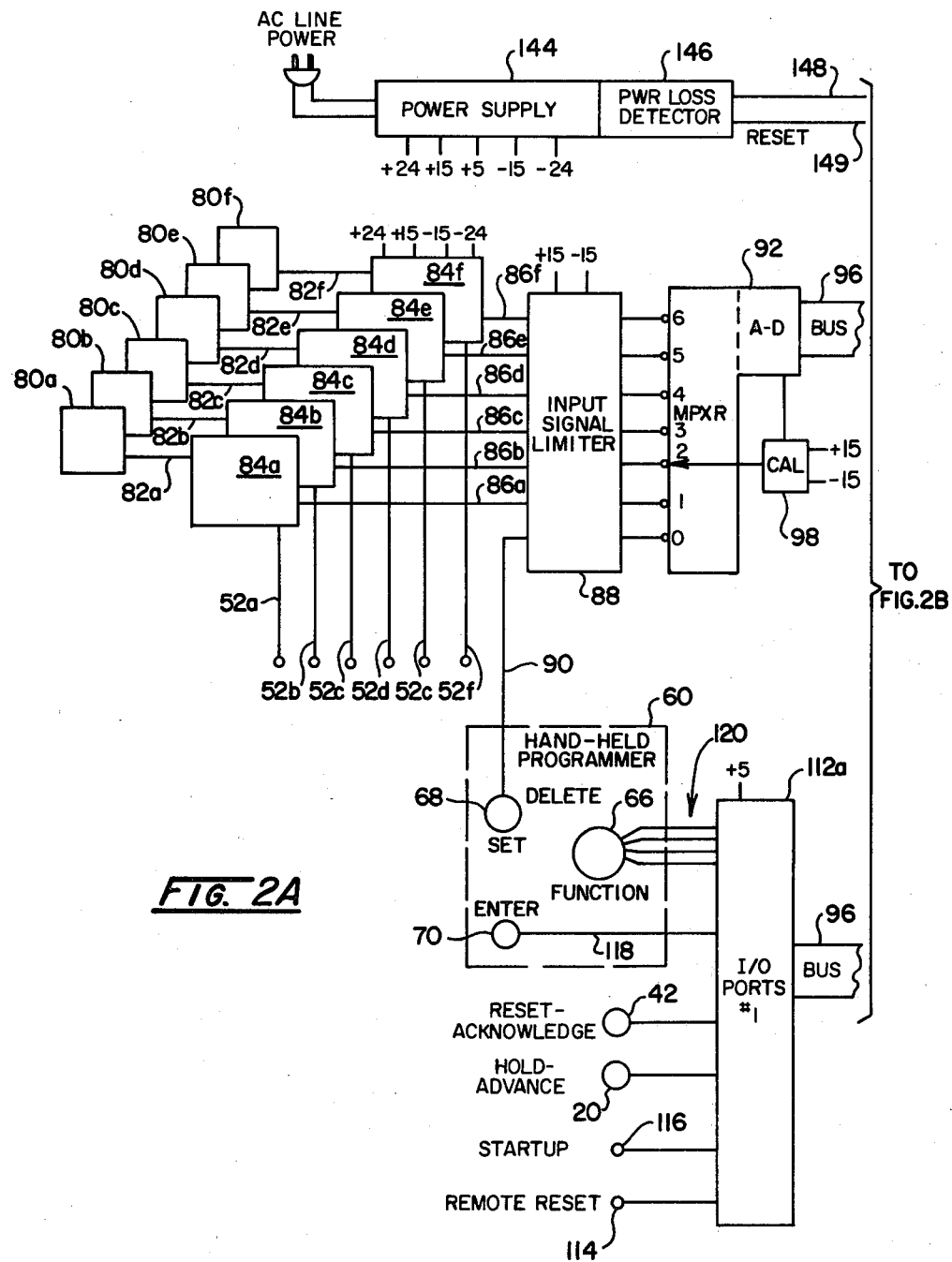

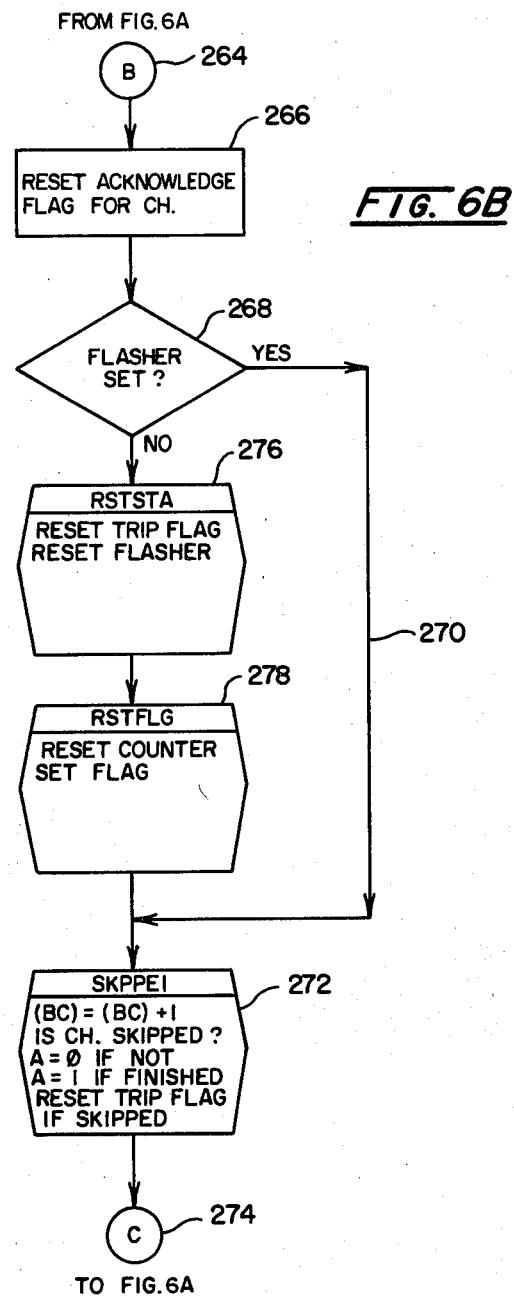

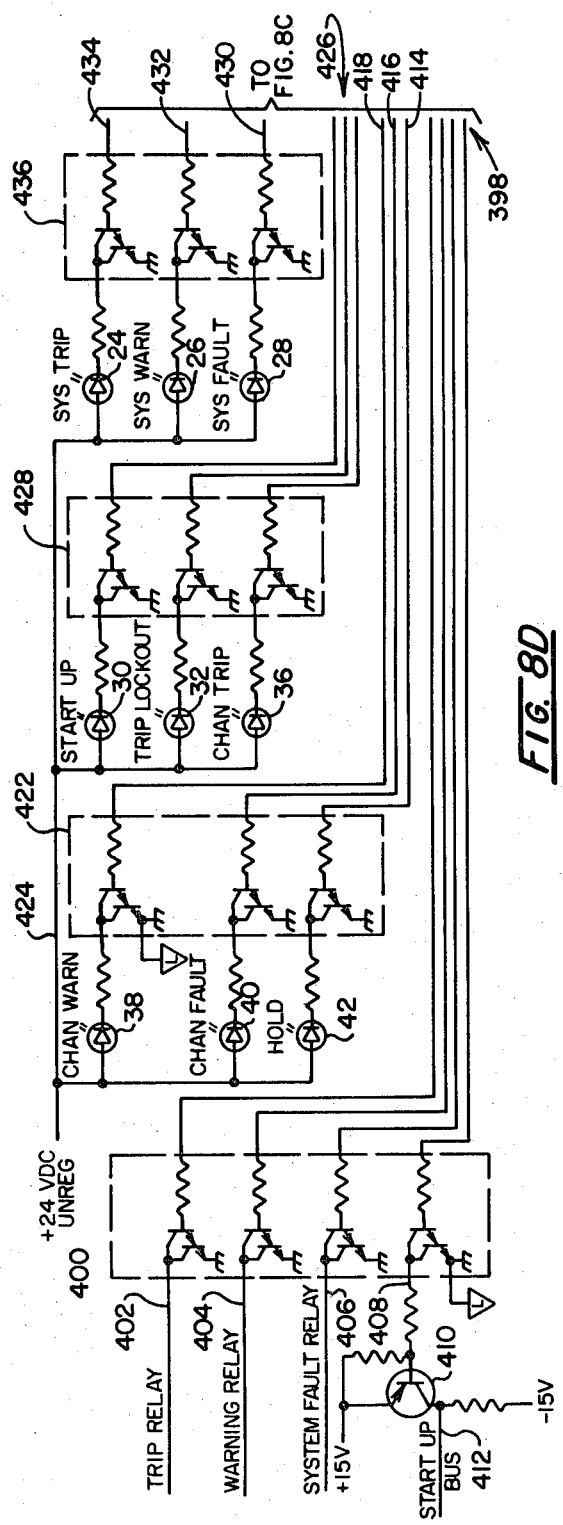

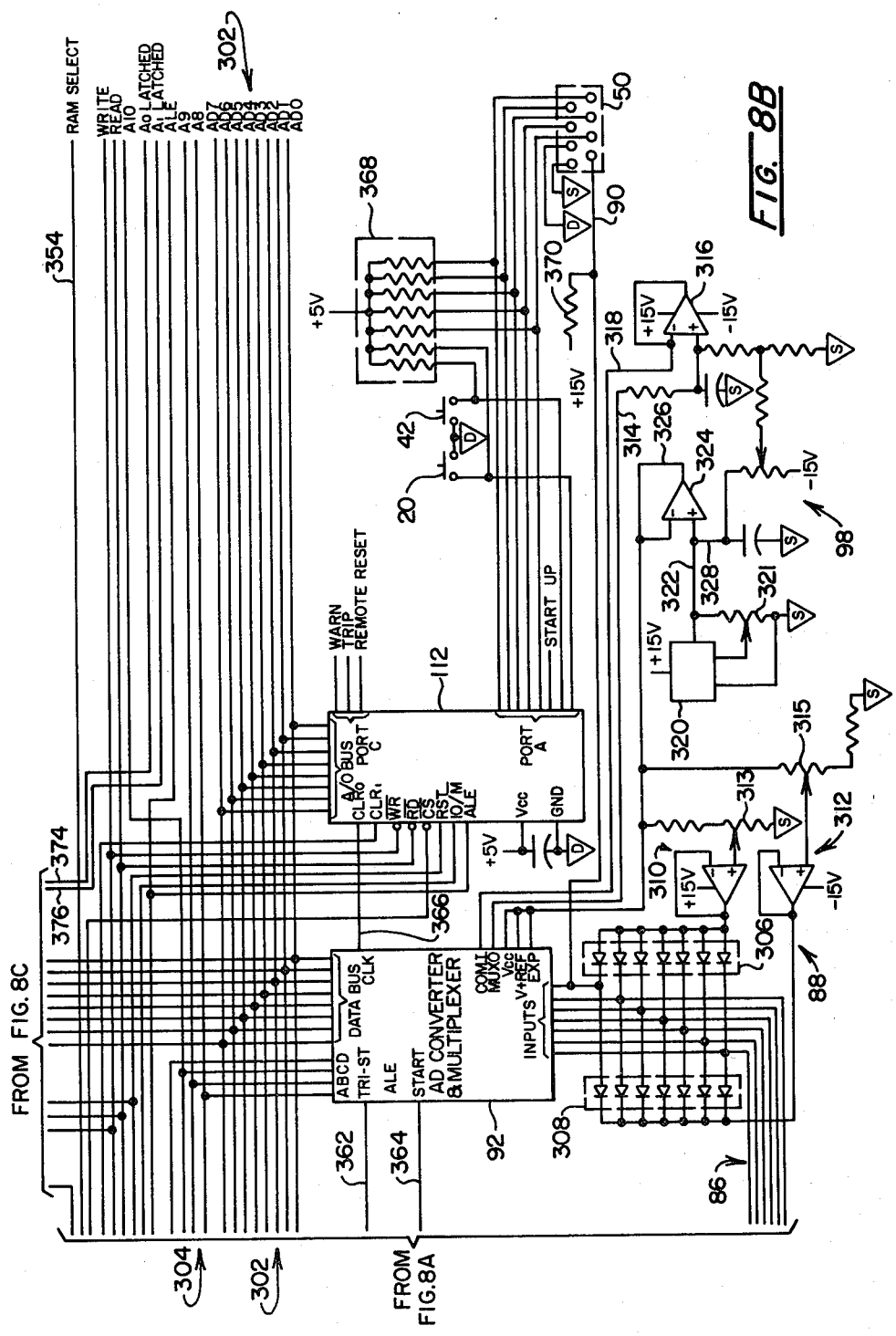

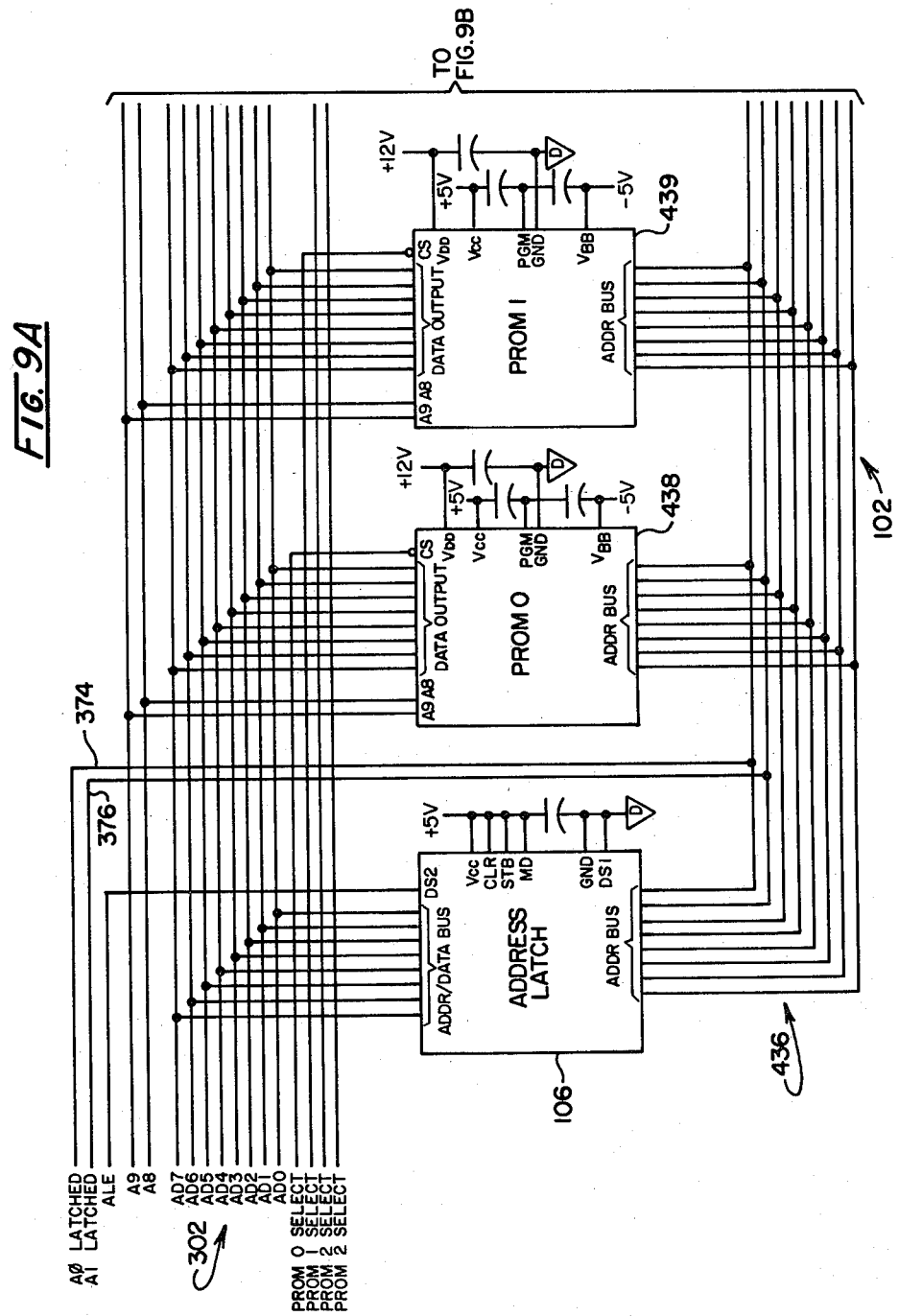

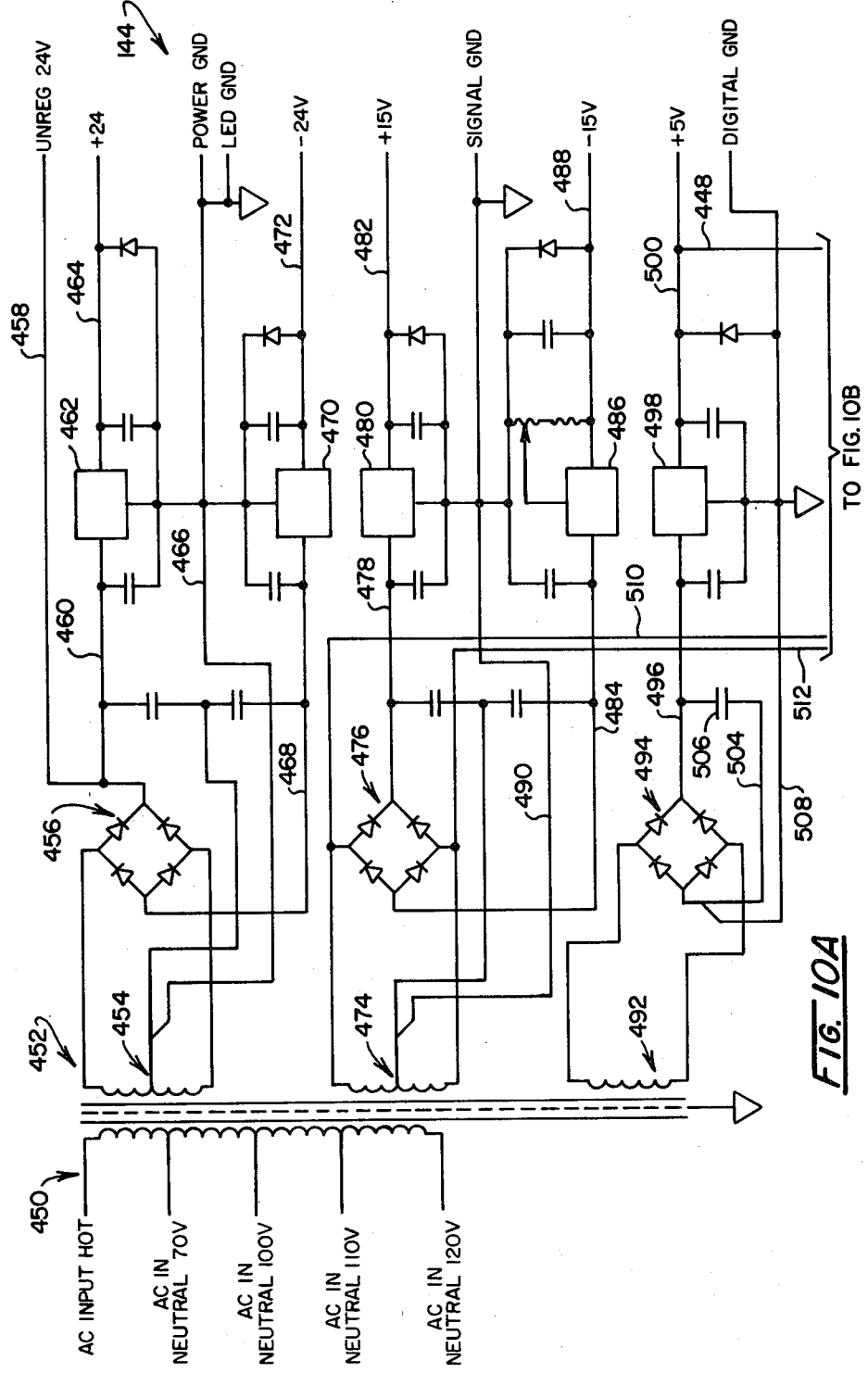

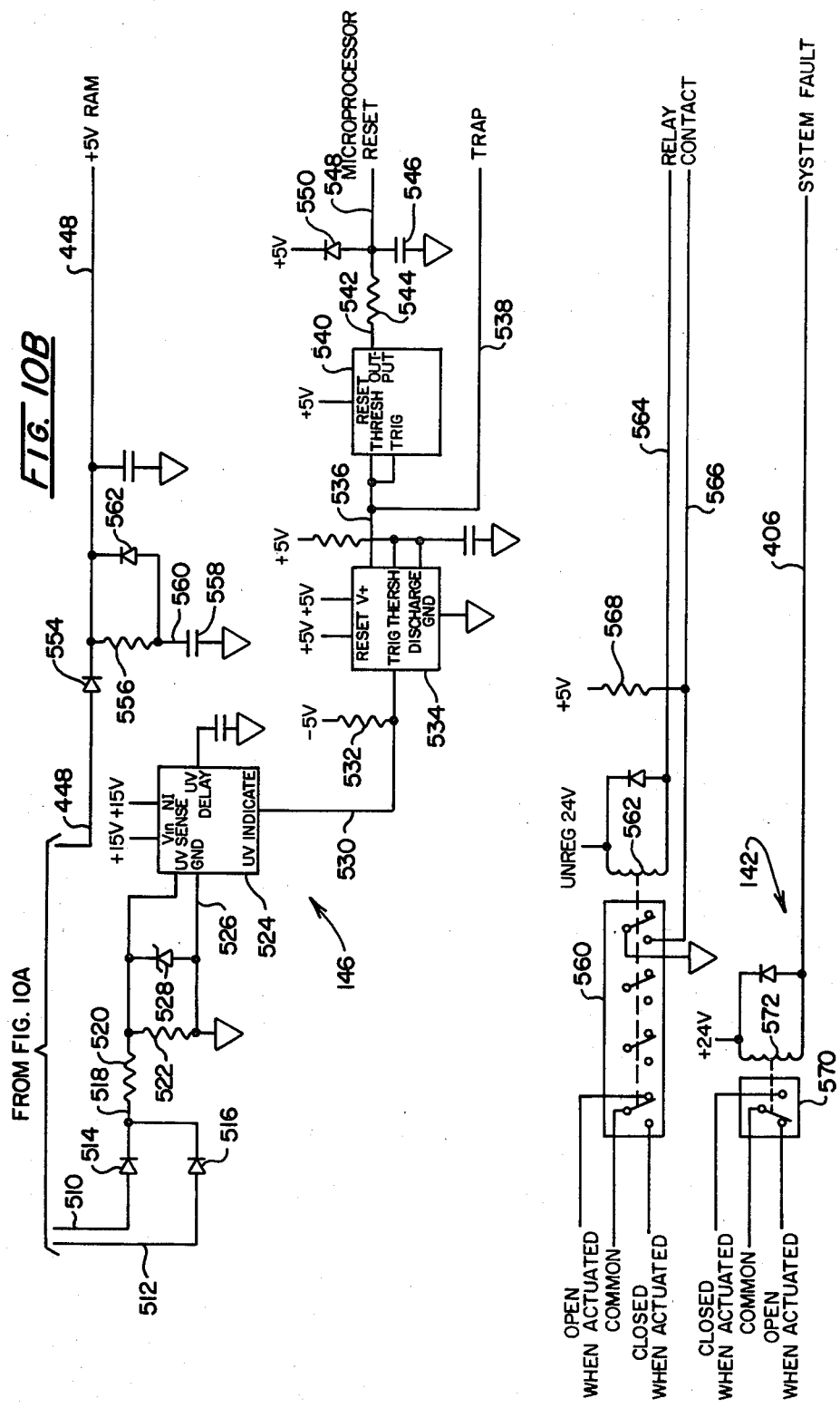

MACHINE MONITORING SYSTEM AND APPARATUS

BACKGROUND

For a considerable period of time, industry has relied upon a concept for preventative maintenance which is based upon the detection, analysis and correction of vibration in monitored machinery. Initially, periodic vibration measurements were made at various locations upon industrial machinery to detect an increase in vibration which represented that machine deterioration was at hand. An analysis of vibration was found to provide information which could indicate what trouble was at hand so that proper corrective action would be taken. This general concept of preventative maintenance has grown considerably to the extent that vibration monitors now are permanently installed upon critical machines to provide continuous vibration output signals.

The varieties of vibration monitors vary considerably in capability and complexity, however, all seek the avoidance of catastrophic breakdown through techniques wherein operating personnel are given as much information concerning machine condition as is practical. As might be expected, as the number of positions upon machinery being monitored by transducers, referred to as "channels," as well as the number of machines being monitored increases, so also do the number of visual readout devices increase. Thus, operators and maintenance personnel are called upon to devote a considerable amount of time and effort in operating the monitoring devices themselves, and such efforts are quite important. Further, the number of electrical and electronic components within each of many channels has become significant in terms of cost.

Generally, limits for the values of vibration parameters are predetermined such that conditions representing a warning of imminent malfunction may be known and, in many installations, "trip" or "warning" levels are established. For the latter conditions, relays or the like are actuated automatically to shut down respectively the monitored machinery or energize a perceptible indicator. As is apparent, it is desirable to apprise operating personnel of the status of all monitored positions in as simple and thus efficient a manner as possible. To the present, separate meter readings at each monitoring station or channel are taken by the operators, these readings are then mentally compared with pre-designated warning or trip levels and a mental determination is made as to whether further corrective action should be taken. Of course, the mental steps involved in this procedure represent a potential error factor as well as one representing the consumption of operator time.

Because the shutdown of monitored machinery represents an undesirable loss of production, the tampering with preset trip levels by personnel can be contemplated. To discourage such tampering, potentiometers or like adjustable devices setting such limits with respect to each monitoring channel have been positioned at relatively inaccessible locations. For example, portions of the monitoring equipment may have to be removed in order to achieve access to the adjusting devices. While enhancing the security of the monitoring devices, such inaccessibility has represented an obvious inconvenience.

SUMMARY

The present invention is addressed to an improved system and apparatus for monitoring the operation industrial devices. Capable of operation in conjunction with a plurality of channels, monitoring apparatus according to the invention provides easily interpreted readouts of warning and trip levels simultaneously with the corresponding instantaneous relative value of a monitored parameter, for example, the amplitude of a vibration expresed in velocity, acceleration or displacement units. These readouts are perceived as spaced light sources along a common relative scale. Thus, the operator observes a trip or warning location as a small light and the monitored vibration reading as another relatively spaced light source. Accordingly, the information representing the status of a monitored channel may be understood without the need for carrying out computations or the like. This informational readout utilizes a linear scale in the nature of a bar chart which, preferably, is formed of a linear array of light emitting diodes.

Through the use of microprocessor technology, multiple channel performance is provided with the system wherein such simultaneous readouts are made available for each channel on a predetermined, sequential basis. Combined with each such linear scale readout are additional readouts indicating the status of the entire monitoring system as well as an operational status with respect to warning or trip conditions for each individual and indicated channel. Advantageously, the number of electronic components required to establish each channel is significantly reduced.

The insertion or changing of predetermined trip levels within the apparatus of the system is considerably facilitated through the use of a small, hand-held programing device which simply is plugged into the monitoring apparatus and manipulated by the operator. Advantageously, the readout for the hand-held device is the linear scale of the monitoring apparatus itself. When inserting limit data and the like using the hand-held programmer, the operator may observe the readout position of earlier inserted limit data, provide instantly observable changes in such data and selectively enter the new data by the simple expedient of depressing an enter switch. In addition to entering limit data, the hand-held programmer may be utilized to insert such control data as time delays for suppressing trip activity, as well as for suppressing readouts for predetermined intervals, for example, at the commencement of the start-up of monitored machinery. The hand-held programmer is small in size to the extent that it may be secured through the simple expedient of locking it in a desk drawer and is desirably passive in nature to the extent that it draws upon the electrical power of the monitoring apparatus itself to carry out its function.

A particularly advantageous aspect of the invention resides in the provision of an improved monitoring readout and programming arrangement having an enhanced operational capability at costs well below the equipment heretofore made available in the marketplace.

Another feature and object of the invention is to provide an improved monitoring apparatus incorporating a linear array of indicators, each such indicator being discretely energizable in response to an input signal. Provided also is a scale arrangement including linearly disposed graduation indicia which are aligned generally in parallel with and adjacent to the linear array of indicators for providing a scale level correspondence with each of the indicators. Signal treatment is provided which is responsive to the outputs of monitoring transducers for deriving a data signal, for example, in binary form. A processor is provided which is responsive to such data signal which includes a memory for retaining a limit datum corresponding with a threshold level selected in association with a select performance parameter of the monitoring device for deriving a control output. Additionally, a decoder is included which is responsive to the control output for deriving a first input signal for energizing a first indicator adjacent to the scale indicia having a graduation value corresponding with the data signal deriving from a transducer output and, simultaneously, deriving a second input signal for energizing a second indicator adjacent a scale indicia having a graduation value corresponding with the above-mentioned limit data.

Another feature and object of the invention is to provide an improved system for monitoring operational devices through the use of transducers associated therewith, each such transducer having an output corresponding with a select parameter and the system including a monitoring apparatus having a linear array of indicators each of which is discreetly energizable. A scale including linearly disposed graduation indicia is aligned generally in parallel with and adjacent to the linear array of indicators for providing a scale level correspondence with each indicator. An input arrangement is provided for establishing a plurality of channels, each channel being uniquely responsive to receive a select transducer output. A signal treating network is incorporated within the apparatus which is coupled with the input channels and which is responsive to the transducer outputs for deriving data signals. Such data signals may be binary in nature. A channel identification arrangement responsive to a control input is provided to generate a visual indication of a given channel which is being monitored and for which readouts are provided. A processor is incorporated within the apparatus which is responsive to discrete ones of the data signals in a predetermined scanning sequence. The processor further includes a memory for retaining limit data corresponding with the threshold level selected for each channel in association with a corresponding select parameter for retaining control data, for carrying out comparisons of each of the data signals with corresponding limit data and for deriving control outputs. A decoder arrangement is provided which is responsive to the control outputs for energizing a first indicator adjacent a scale indicia having a graduation value corresponding with the data signal deriving from a predetermined channel and, simultaneously, energizing a second indicator adjacent a scale indicia having a graduation value corresponding with limit data for a predetermined channel and, simultaneously, deriving the control input to effect the provision of visual identification of the predetermined channel being monitored.

As another object of the invention, the above monitoring apparatus is formed including an externally exposed connector for effecting a signal transfer relationship with the processor therein and the signal treating arrangement. The system further includes a portable programmer which includes a signal coupling device for removable insertion in signal transfer relationship with the externally disposed connector. A hand manipulative programming component is provided with the portable programmer which is coupled with the coupling device and which is movable between limiting positions to derive corresponding output conditions. The processor of the apparatus is responsive to the hand manipulative programming component output conditions to effect a decoder derived energization of an indicator within the linear array in correspondence therewith.

Other objects of the invention will, in part, be obvious and will, in part, appear hereinafter. The invention, accordingly, comprises the system and apparatus possessing the construction, combination of elements and arrangement of parts which are exemplified in the following disclosure.

For a fuller understanding of the nature and objects of the invention, reference should be had to the following detailed description taken in conjunction with the accompanying drawings.

BRIEF DESCRIPTION OF THE DRAWINGS

FIGS. 2A and 2B represent a schematic diagram of the system and apparatus of the invention;

FIGS. 6A and 6B represent a flowchart describing an update routine generally discussed in conjunction with 3B;

FIG. 7 is a diagram showing the proper positioning of FIGS. 8A-8D;

FIGS. 8A-8D are a circuit diagram of apparatus according to the invention;

FIGS. 9A and 9B are a circuit diagram showing the memory functions of the apparatus of the invention;

FIGS. 10A and 10B are a schematic circuit diagram showing relay and power supply functions utilized with the apparatus of the invention;

DETAILED DESCRIPTION

Figure 1:
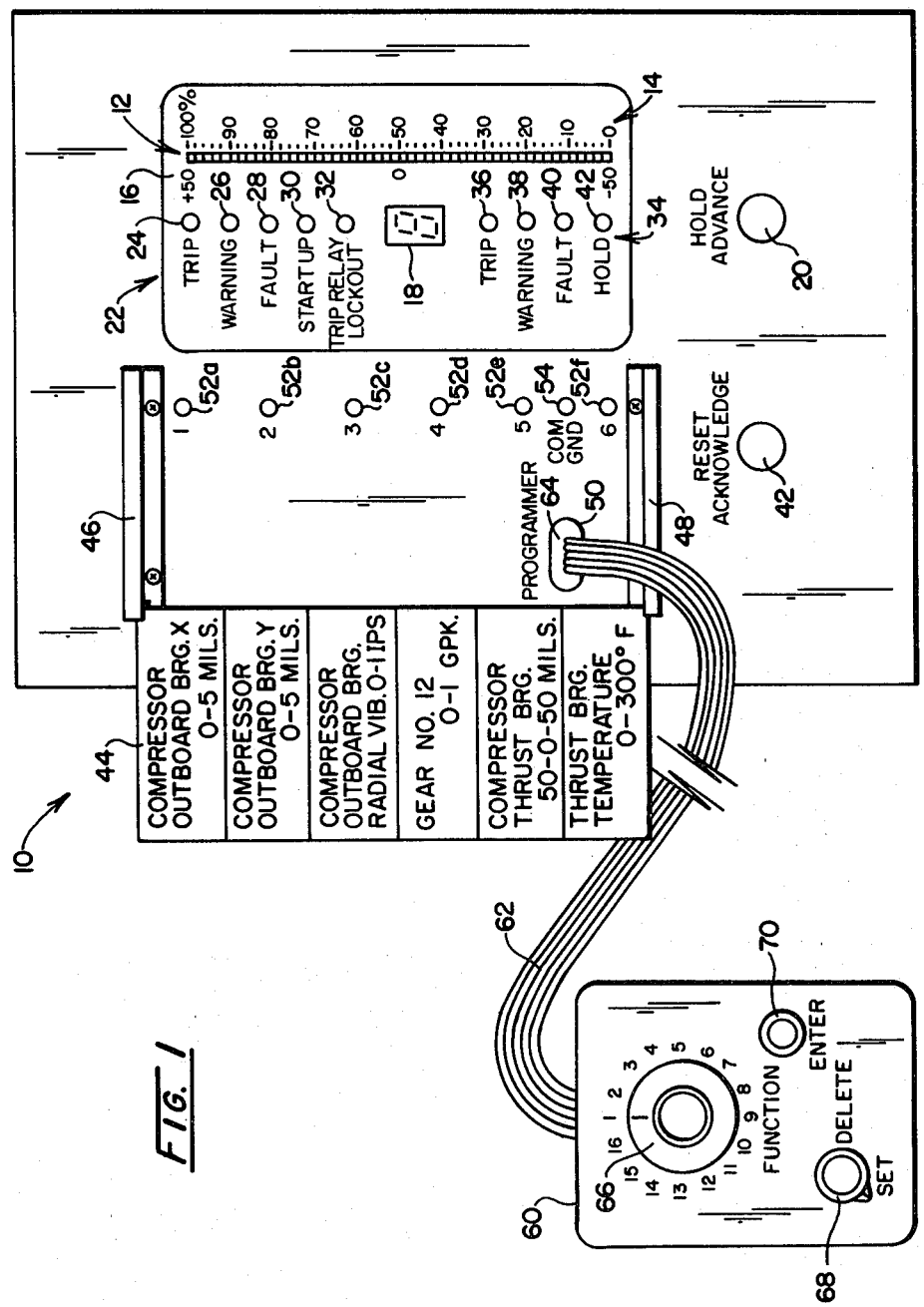
FIG. 1 is a plan view of a forward portion of apparatus according to the invention, the apparatus being shown in conjunction with a hand-held programmer connected thereto.

Referring to FIG. 1, the outwardly disposed operational or readout surface of monitoring apparatus according to the invention is revealed generally at 10. Paramount among the readout components of this surface 10 is a linear array of light-emitting diodes (LED's) 12, which array is vertically oriented, the discrete indicators or LED's therein being regularly spaced and 51 in number. Positioned adjacent LED array 12 is a scale 14 having linearly disposed graduation indicia aligned in parallel with the array 12, each indicia of which is positioned adjacent an indicator LED for providing a scale level correspondence therewith. Note, that the scale 14 is arranged such that the indica thereof represent an aliquot division of a range of values extending from a lower to an upper level. In particular, the scale is shown as a percentage one, each indicia representing a 2 percent valuation ranging from 0 to 100. This scale 14, as utilized in conjunction with array 12, forms a type of bar chart readout suited for use in conjunction with a variety of measured parameters. Another scale of lesser detail is shown at 16 positioned on the opposite side of linear array 12. This scale provides a zero or mid-valuation in correspondence with the 50 percent level of scale 14 and is shown ranging to a value of +50 at the 100 percent level of scale 14 and −50 at the zero level of the latter scale. Accordingly, scale 16 may be used in conjunction both with array 12 and scale 14 to show sign related deviations from a central or null position. Note, further, that the individual LED's or indicators within array 12 are formed having a relatively flat rectangular bezel to enhance the readability of their levels with respect to the graduations of scale 14.

The readouts associated with array 12 and corresponding scale 14 and 16 represent monitoring valuations derived from the output signals of one and, preferably, a plurality of machinery monitoring transducers (not shown). Such transducers are known in the industry and principally serve to monitor the vibrational aspects of dynamic industrial devices. For example, the output signals of the transducers may correspond with or be treated to correspond with the acceleration, velocity or displacement of a particular vibration of equipment being monitored. Additionally, proximity detectors and the like may be utilized to measure thrust or similar aspects, the resultant d.c. form of signal being generated having both positive and negative aspects which may be read, for example, in conjunction with scale 16. Temperature represents another d.c. level signal which may be monitored and all such monitoring signal inputs are asserted at the monitoring apparatus through designated "channels." The monitoring apparatus of the invention carries out a scanning procedure wherein data for each such channel are displayed in bar chart form through LED array 12 in conjunction with a simultaneous display of the identification of the individual channel being considered. The latter display is provided by a seven segment LED channel readout 18. Preferably, the sequence of display is carried out providing convenient intervals for readout, for example 5 seconds, for each channel. Should the operator wish to retain a particular channel readout, a "Hold-Advance" switch 20 may be actuated. Switch 20 operates such that a first depression thereof retains the channel being displayed until a next actuation. Such next actuation always will numerically advance the channel number and corresponding array 12 readout.

Positioned above channel readout 18 is a grouping of system indicators represented generally at 22. Within grouping 22 is a "TRIP" indicator 24 which is present as an LED having a circular bezel mounting and of relatively larger area than the individual LED's forming array 12. The trip indicator 24 is illuminated on an intermittent or flashing basis when a monitored transducer signal reaches a predetermined level representing that the monitored machinery should be shut down to avoid catastrophic damage. Indicator 24 will flash if any channel in the system reaches such a predetermined level and if all channels have not been acknowledged using switch 42. The next lower indicator is provided as a similar LED 26 and is shown adjacent a label, "WARNING." This indicator will be illuminated on an intermittent or flashing basis at such time as a transducer output signal reaches a level at which the operator should be warned that unusually high levels of vibration or the like are being encountered. Positioned beneath the indicator 26 is an LED indicator 28 which is illuminated on a steady state basis in the event, for example, that a transducer output signal is not within known upper or lower signal level limits. Labeled "FAULT," illumination of LED 28 apprises the operator that one or more channels within the system is receiving defective signals. Such defects may occur with the severance or disconnection of a cable leading to a transducer as well as the breakdown of a given transducer in the rigorous environment within which they are usually called upon to perform. No shutdown is carried out with the development of a fault level signal; however, a relay may be energized. Beneath indicator 28 is positioned an indicator 30 which may be present as an LED. Labeled "STARTUP," indicator 30 is illuminated in steady state fashion where it is desired to suppress all monitoring levels, i.e., reduce monitoring sensitivity, during a period when the machinery being monitored is initially turned on. Often, during such periods of time, spurious signals are encountered which, within reasonable bounds, safely may be ignored by the system. Accordingly, trip shutdowns and warning indications are, to an extent, avoided during the relatively short interval for startup, and indicator 30 represents that such suppression is underway. At the termination of the predetermined startup interval, LED 30 is deenergized. Positioned below indicator 30 is an LED indicator 32 labeled "TRIP RELAY LOCKOUT" which is illuminated in steady state fashion upon command of the operator for purposes of deactivating trip relays which otherwise might shut down monitored machinery. Such deactivation generally takes place during programming intervals wherein warning and trip levels are programmed into the monitoring apparatus.

A next grouping of channel dedicated visual indicators is represented generally at 34. The uppermost indicator 36 of grouping 34 is provided as an LED labeled "TRIP" which, in the absence of acknowledgement, is energized to flash at 2 Hz. in the event a trip level has been equalled or exceeded and the channel at which such trip occurred is displayed at channel readout 18. This condition will persist for the earlier described 5 second period of dwell for a particular channel display. Accordingly, as the channel number at 18 transitions to a next higher level, and no trip condition obtains for the next succeeding channel, trip LED 36 will cease to be intermittently energized. Similarly, positioned below indicator 36 is an LED indicator 38 carrying a "WARNING" label. This indicator operates similar to that described at indicator 26, however, it is dedicated to the particular channel represented at indicator 18 in similar fashion as the trip indicator 36. Accordingly, LED 38 is intermittently energized, for example at a 2 cps rate, until such time as a numerical transition occurs at indicator 18. Positioned below indicator 38 is an LED indicator 40 adjacent which is positioned the label "FAULT." Indicator 40 serves the same function as fault indicator 28 for the system, however, as before it is energized in steady state fashion upon the detection of a fault condition for the interval of dwell of the pertinent channel represented at indicator 18, following which it is deenergized. Located below indicator 40 is an LED indicator 42 adjacent which the label "HOLD" is positioned. Indicator 42 is energized in steady state fashion at such time as the operator, having depressed or actuated switch 20, has caused the system to maintain the visual outputs corresponding with a selected channel represented at indicator 18. This condition will obtain and LED 42 will be energized continuously in steady state fashion until such time as the operator again actuates hold-advance button or switch 20.

As discussed above, the trip and warning indicators within each of groupings 22 and 34 are energized on an intermittent or flashing basis. When this situation occurs, and when trip or warning indicators 36 and 38 are intermittently energized, the operator may depress switch 42 to carry out a reset-acknowledge function. An acknowledgement function is one wherein the trip or warning condition continues and upon depressing switch 42, the intermittent energization of indicators 36 or 38 is altered to a steady state one to represent acknowledgement. If more than one channel of the system has a trip or warning condition, the system indicators 24 and 26 within grouping 22 will continue to be energized intermittently. Acknowledgement can only be carried out effectively by actuating switch 42 at such time as the pertinent channel is represented at indicator 18 and either indicators 38 or 36 is in a flashing readout mode. In the event that the signal level of a channel otherwise having developed a trip or warning readout condition falls below the predetermined threshold levels causing such readout, then an actuation of switch 42 by the operator will cause the system to carry out a conventional reset function, all pertinent indicators being deenergized.

It is desirable that the operator of the system have available information as to which transducer and related channel has undergone a warning condition first in any series of multi-channel trip or warning conditions. With such information, the operator is apprised as to where a problem condition commenced. Accordingly, where a trip or warning representing a singular or multi-channel series thereof is represented at indicators 36 or 38, for a particular channel, if such channel is the first of a grouping thereof to occur, the channel display at indicator 18 will be energized intermittently or caused to flash at a predetermined rate, for example, 10 Hz during its 5 second identification interval. Such arrangement continues until all involved channels have been effectively reset.

Positioned adjacent the readout assembly is an engraved plate 44 which identifies, for example, the six channels being monitored in a sequence from top to bottom. Information is given as to the range or limits of monitoring for each channel, for example with respect to velocity, displacement, acceleration, temperature and the like. In evaluating the condition of any channel represented at indicator 18, the operator will observe a steady state energization of a given LED within array 12 adjacent, for example, the percentage indication at scale 14. Simultaneously represented within LED array 12 will be the upper and lower predetermined threshold limits for both trip and warning conditions. This indication will be by an intermittent energization, i.e. at 12.5 cps, of the four pertinent LED's within array 12. Thus, the operator immediately perceives a relative valuation of the proximity of a monitored output signal with respect to threshold limits. No computations are required, the operator easily understanding the difference between levels as the condition obtaining at the monitored channel. Should an accurate numerical recordation be desired, the percentage representation of the steady state monitored signal may be applied to the range indicated for the pertinent channel within plate 44. Where negative and positive signal values are involved, the scale 16 is utilized, the pertinent channel signal again being shown as a steady state illuminated LED of array 12 positioned either above or below the zero level. The graduations at percentage scale 14 are utilized to provide the precise reading for scale 16. Here again, upper and lower limits are represented by flashing LEDs within array 12. Should the signal value go "above scale," i.e. above 100 percent, than the uppermost LED of array 12 is energized intermittently at a 2 Hz rate. The threshold limit indicating LEDs within array 12 are energized intermittently, for example, at a 12.5 Hz rate to provide visual distinguishment between those levels and the steady state monitored level. As is disclosed later, the predetermined threshold limits also may be selectively deleted where not required for a given application.

Engraved plate 44 is shown displaced from its normal positioning within parallel spaced retainers 46 and 48. As represented in the figure, when engraved plate 44 is removed from these retainers, a connector or jack 50 is exposed. Additionally, a series of output jacks 52a-52f are exposed, as well as a "common" jack 54. These jacks permit the insertion of a corresponding connector to provide for the coupling of signal analysis equipment with the output of any given channel designated transducer. Such analyzers, for example, provide for spectral analysis of amplitudes and frequencies exhibited by the transducers so as to more accurately develop the cause of vibrational problems.

The programming of threshold limits such as warning and trip set points as wall as fault limits, time intervals and the like for the apparatus represented at 10 is carried out through the use of a small, hand-held portable programmer 60. Programmer 60 is configured to include a small lightweight housing as illustrated from which extends a flexible multi-conductor cable 62 terminating in a multiple pin connector 64. Connector 64 is inserted within a connector 50 (see later figures) in signal transfer relationship. The components retained by hand-held programmer 60 are quite simple and few in number, permitting its conveniently small size but not limiting its capability of providing a broad range of programming inputs to the system. Its housing is readily fabricable in small enough dimension to permit the retention thereof in secure fashion, for example, in a desk drawer. Positioned upon programmer 60 is a multi-position, hand-manipular function switch 66 which is of a binary variety and which may be positioned to any of a plurality of numbered function orientations. Also positioned upon programmer 60 is a hand-manipular programming component 68 which, for example, may be present as a conventional potentiometer. The final component mounted upon the housing 60 is an "enter" switch 70 which, when actuated, serves to insert the function coded data evolved from programming component 68 into the memory facilities of the system. No power supply is present with the hand held programmer, such power being derived as an output from the monitoring apparatus through connector 50 as associated with connector 64 and cable 62. A particularly advantageous aspect of the arrangement resides in the utilization of the readout provided by linear LED array 12 in combination with scale 14 in conjunction with the selection and subsequent insertion of data through the manipulation of component 68 and function selector switch 66. For example, a given function is selected with switch 66 and the signal level desired for establishing threshold levels or set points, time intervals or the like is evolved by manipulation of component 68 as the corresponding signal level is displayed at array 12.

Where prior set points or threshold levels have been established for the pertinent channel, those set points additionally will be illuminated in intermittent fashion, for example at 12.5 Hz, within array 12. Thus, the programming operator has a continuous readout during the process of selecting desired limit levels. By actuating enter switch 70, the new levels are inserted within memory and the earlier and now replaced levels are extinguished. Following the carrying out of programming procedures, connector 64 is removed from corresponding connector 50 and engraved plate 44 is reinserted within retainers 46 and 48. Preferably, the functions selected by switch 66 are identified about the switch by number and are described on the operational surface of apparatus 10 beneath plate 44. Exemplary of such functions for monitoring equipment are the following function descriptions:

Hand-Held Programmer

1. Scan
2. Trip Lockout
3. Test Panel Indicators
4. Sensor High
5. Trip High
6. Warning High
7. Warning Low
8. Trip Low
9. Sensor Low
10. Trip Time Delay
11. Warning Time Delay
12. Startup Time Interval
13. AND Vote 2 Channels
14. Skip Channel Looking to the above numerical functions, function 1, "Scan" permits the system to operate in unobstructed fashion, the sequential channel scanning arrangement being carried out without change. Function 2, "Trip Lockout" prevents the actuation of the trip relay in conjunction with a signal level reaching a trip condition. As noted above, the entry of such a function signal will additionally cause the energization in steady state fashion of LED indicator 32.

Function 3, "Test Panel Indicators" provides an illuminating test of all LEDs within the operating face 10 in response to the actuation of enter switch 70.

Functions 4 and 9, identified respectively as "Sensor High" and "Sensor Low," establish threshold limits corresponding with the known operational signal range of a given transducer within a given channel. This input is utilized to establish levels for the earlier described fault function, any signal developed by a transducer being above or below these values being considered to be derived from a faulty one or associated with some fault condition. Other system fault signals may be programmed into the system.

Functions 5 and 8 representing, respectively, "Trip High" and "Trip Low" provide for the insertion of the threshold levels for a trip function. Similarly, functions 6 and 7 representing, respectively, "Warning High" and "Warning Low" provide for the insertion of set point or threshold limit values constituting a warning condition.

Function 10 and 11, labeled, respectively, "Trip Time Delay" and "Warning Time Delay" provide for the insertion of up to, for example, a ten-second delay which responds to the development of a warning or trip condition and suppresses such condition for the selected time interval. In inserting the time delay data, as before, the operator merely observes the position of illumination of a pertinent LED within array 12 which corresponds to the orientation of component 68 and when a select value is observed, enter switch 70 is actuated. For purposes of reading out scale 14, for example, the entire range of 0-100 percent may readily be correlated to a maximum interval span of 10 seconds. Similarly, function 12, labeled "Startup Time Interval" provides for the insertion of a selected time interval, for example within a range of 0-100 seconds, for carrying out a suppression of transducer signals following the activation of the machinery or devices being monitored. In this case, a full-scale representation would be provided at scale 14 for the 100 second maximum available interval of selection.

Function 13, labeled "AND vote two channels" provides a facility for requiring that trip levels be achieved for two distinct channels and their associated transducers in order to cause a trip condition to occur. The channel selection for this function is provided by turning switch 66 to its designated position 13, whereupon enter switch 70 is actuated when the normally sequencing channel identification at indicator 18 is energized to represent one of the two channels desired to be ANDed. This feature permits, for example, the utilization of two transducers at a location representing a highly rigorous environment. If one such transducer should be damaged in a manner wherein the output signal represents what amounts to be an invalid trip condition, then the second or redundant transducer must also reach that level before a trip condition is evoked by the system.

The system operates during an ANDing to display a channel number at indicator 18 representing that channel then being monitored. However, such display also apprises the operator of that channel representing the second ANDed component. For example, assuming channels 1 and 5 have been ANDed and that the 5 second dedicated channel display is to channel 1, then a 1 will be displayed for one second followed by the display of the number 5 for one-half second. Next, a 1 is displayed for one-half second, then 5 for one half second. Finally, a 1, representing channel output, is displayed for the remainder of the period of 5 seconds, i.e., for two and one half seconds. The system then sequences to the next channel. As the system sequences to the exemplary channel 5, the reverse form of display is carried out. In the event that channel 1 of the exemplary ANDed channels 1 and 5 is a first channel to experience a trip condition but channel 5 has not experienced it, then the numeral 1 as displayed at readout 18 will be intermittently energized at the earlier described 10 Hz rate.

Function 14, labeled "Skip Channel" provides for the elimination of monitoring activity for any selected channel. Insertion of the appropriate skip channel data into memory is carried out by properly positioning function selector switch 66 and actuating enter switch 70 during such time as the number representing the channel selected for deletion is presented at indicator 18. Such actuation will cause the energization of an indicator 18 decimal point. As is apparent from the above, to insert data for any given channel, it is necessary for the number designating that channel to be asserted at indicator 18. This can be carried out during the normal 5 second interval sequencing of channel numbers at indicator 18 or during a longer interval derived through the activation of hold-advance switch 20.

Figure 2B:
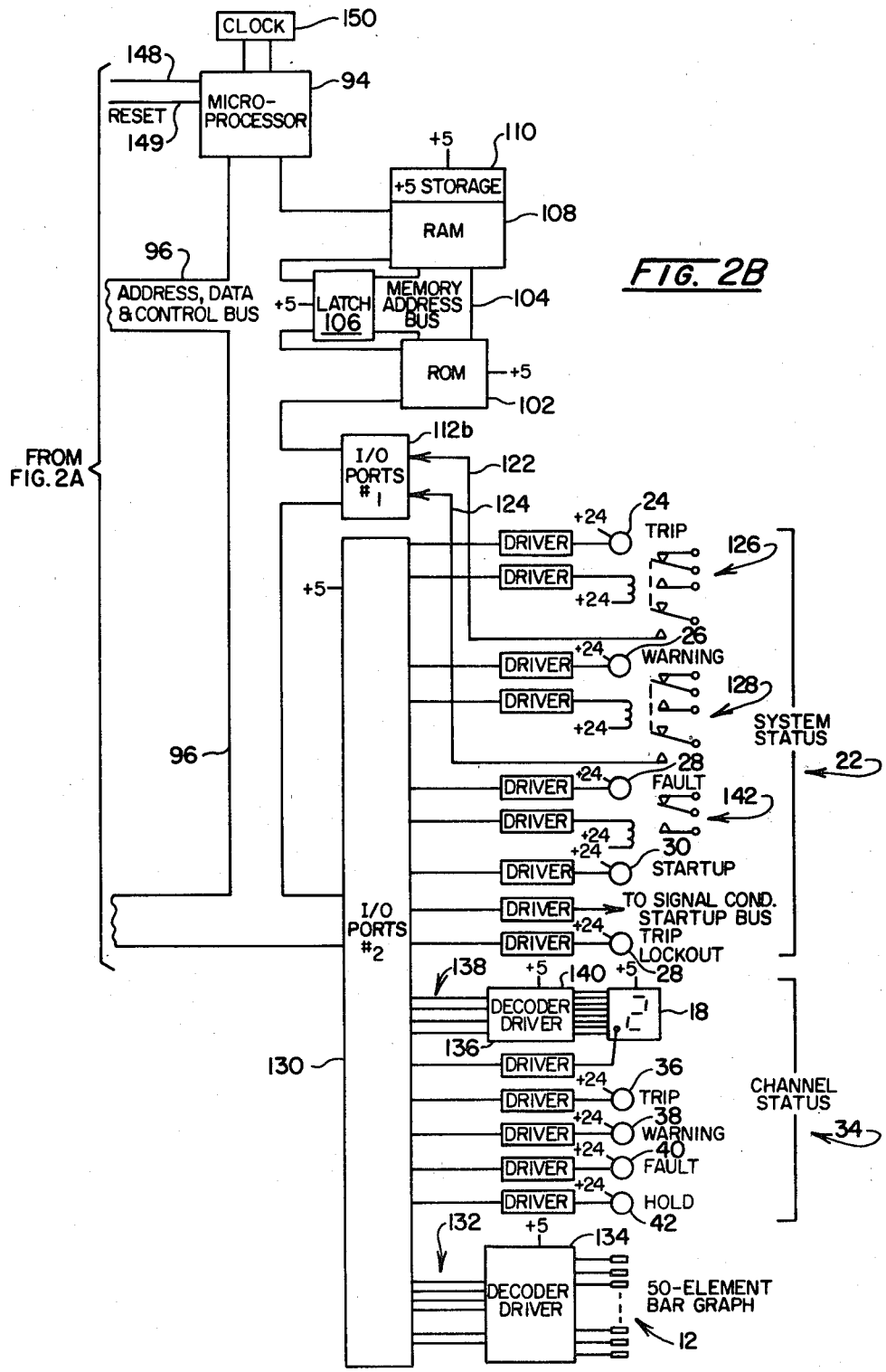

Turning now to FIGS. 2A and 2B; the system of the invention is revealed in broad schematic fashion as operating in conjunction with 6 transducers and, correspondingly, six channels. The noted six transducers are represented in FIG. 2A at blocks 80a–80f, each of these transducers being shown having a respective cable connection represented respectively at 82a–82f with corresponding respective signal conditioner networks 84a–84f. Networks 84a–84f serve purposes of providing gain control, normalized calibration, appropriate signal matching for the various types of transducers which may be utilized, rectification of a.c. signals where appropriate and inputs to the analyzer jacks described earlier at 52a–52f which are represented by that same alphanumeric designation in the instant figure. The outputs of signal conditioners 84a–84f are represented at corresponding respective lines 86a–86f as extending into an input signal limiter network 88 which serves the purpose of protecting downstream circuitry. Additionally, asserted through signal limiter network 88 is an input line 90 representing the output condition of a potentiometer carrying out the function of earlier described programming component 68 and identically numbered. This signal is presented from cable 62 and associated connector 64.

Lines 86a–86f and line 90 extend through network 88, as shown, for assertion at corresponding input ports of a combined multiplexing and analog to digital circuit represented at block 92. Circuit 92 operates, in part, under the control of a microprocessor represented at block 94 (FIG. 2B) by signals asserted from an address, data and control bus function represented at 96. The multiplexing function of circuit 92 serves the apparent function of selecting or activating channel input ports for submitting the d.c. signal levels asserted thereat to an analog to digital conversion function. Prior to such assertion, however, a calibrating network represented at block 98 carries out appropriate calibration of the thus selected signal, the association between selected signal and multiplexing function input port being represented by line 100. Note that line 100 terminates in an arrow pointed at a channel designated as "2," which designation is additionally represented at the channel readout indicator 18 within channel status indicator grouping 34.

Looking to FIG. 2B, microprocessor 94 operates in conventional fashion under instructions from a Read Only Memory represented at block 102 and coupled with address, data and control bus 96. Read Only Memory 102 also is addressed from a memory address bus 104 which is, in turn, coupled with but 96 through a latching network 106. The microprocessor 94 additionally operates upon transient data including set point information, programmer 60 information and the like through the utilization of a read-write memory of a random access variety (RAM) shown at block 108. Memory 108 is addressed from memory address bus 104 and provides input data in conjunction with bus 96. To preserve data being operated upon within memory 108, a power storage arrangement, which may be present as a capacitor or the like, is provided as represented at block 110.

Microprocessor 94 responds to inputed signals through a programmable peripheral interface (PPI) device represented at blocks (I/O ports) 112a and 112b. Coupled with address, data and control bus 96, I/O port 112a may be wired to receive a remote reset signal as represented at terminal 114. This input provides a user resetting function serving to return all warning or trip or other system and channel outputs to an initial state if the levels of vibration have gone below their thresholds. A startup signal input is provided at a terminal 116 which serves to initiate the earlier described startup time delays accompanied by transducer signal suppression. The hold-advance switch 20 as well as Reset-Acknowledge switch 42 are represented in the drawing as having inputs to I/O ports 112a. Similarly, the enter signal generated in conjunction with switch 70 is shown associated with I/O port function 112a through a line 118, while the 4 bit binary output of function selector switch 66 is shown coupled with I/O port 112a through four line array 120. Not shown in the drawing are power supply inputs to programmer 60 from the monitoring apparatus, it being recalled that no power supply is retained within programmer 60. That portion of the I/O port represented at block 112b is shown receiving relay status information from lines 122 and 124 which extend, respectively, to a trip relay 126 and warning relay 128. These lines monitor the tripped status condition of the relays to assure their proper orientations. An improper orientation thereof for a given status will result in the generation of a system fault signal.

These relays may be utilized at the option of the user for purposes of shutting down monitored machinery as well as sounding remote warning devices and the like.

A second programmable peripheral interface (PPI) device principally functioning to provide output signals is represented at block 130. The outputs of device 130 are shown to include a line array 132 leading to a decoder-driver represented at block 134 which, in turn, serves to drive the individual LED elements of array 12. Located above block 132 are output lines leading, as labeled, through driver components to "Hold" LED 42, to "Fault" LED 40 to "Warning" LED 38 and "Trip" LED 36 within the channel status grouping thereof earlier identified in general at 34. The channel identification seven segment LED readout again is represented at 18 having a lead extending through a driver function as repesented at line 136, as well as a binary coded four line array 138 extending to a decoder driver 140 serving, in turn, to define appropriate numerals or letters at display 18.

Located in the drawing above the channel indication readout components are leads leading through driver functions, as labeled, to trip lockout 32, to a signal conditioning network 84a–84f startup bus for purposes of providing a timed suppression of all transducer signals, leading to a startup display LED 30, to a fault signal responsive relay 142, as well as to fault indicator LED 28. These leads, as well as leads through driver blocks leading to relays 126 and 128, warning LED indicator 26 and trip relay indicator 24 are retained within the system status indicator group represented earlier in connection with FIG. 1 at 22 and identified by that numeral in bracket form in FIG. 2.

The power supply network of the system is represented at block 144 which, as schematically represented, is connectable with a.c. line power supply. The various voltage level outputs from circuit 144 are represented as labeled. This power supply also is associated with a power loss detector represented by block 146 which, upon detecting a loss of a.c. line power, provides an initial "Trap" signal along line 148 and a slightly delayed, i.e., about 250 microseconds, Rest signal along line 150 to microprocessor 94. This delay interval permits the assurance that no write activity to RAM 108 is taking place at the time of receipt of the reset signal. A system clock is represented at block 150 having an input to microprocessor 94.

Figure 3A:
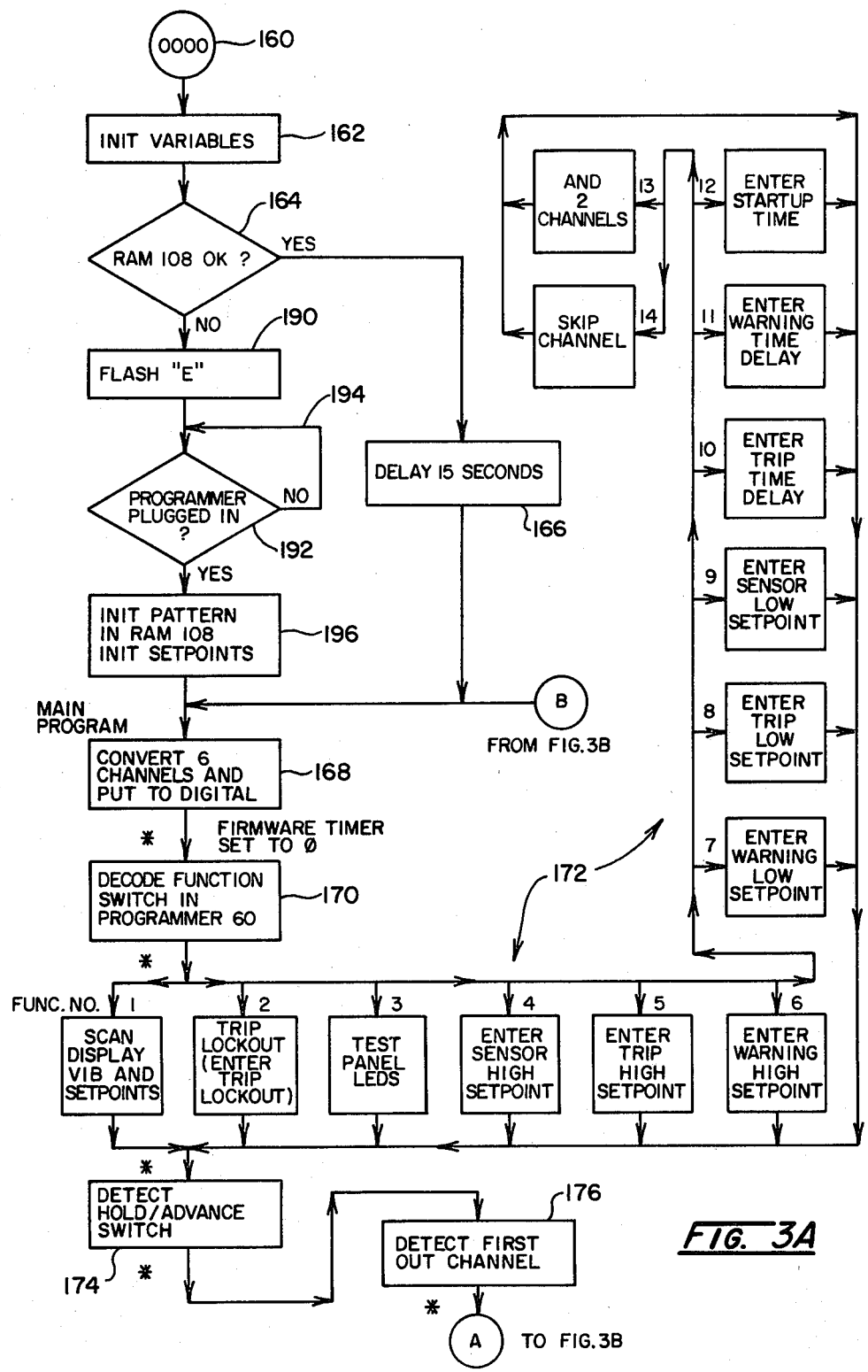
FIGS. 3A, 3B and 3C are flow charts describing the microinstructions of the instant apparatus.
Figures 3B, 3C:
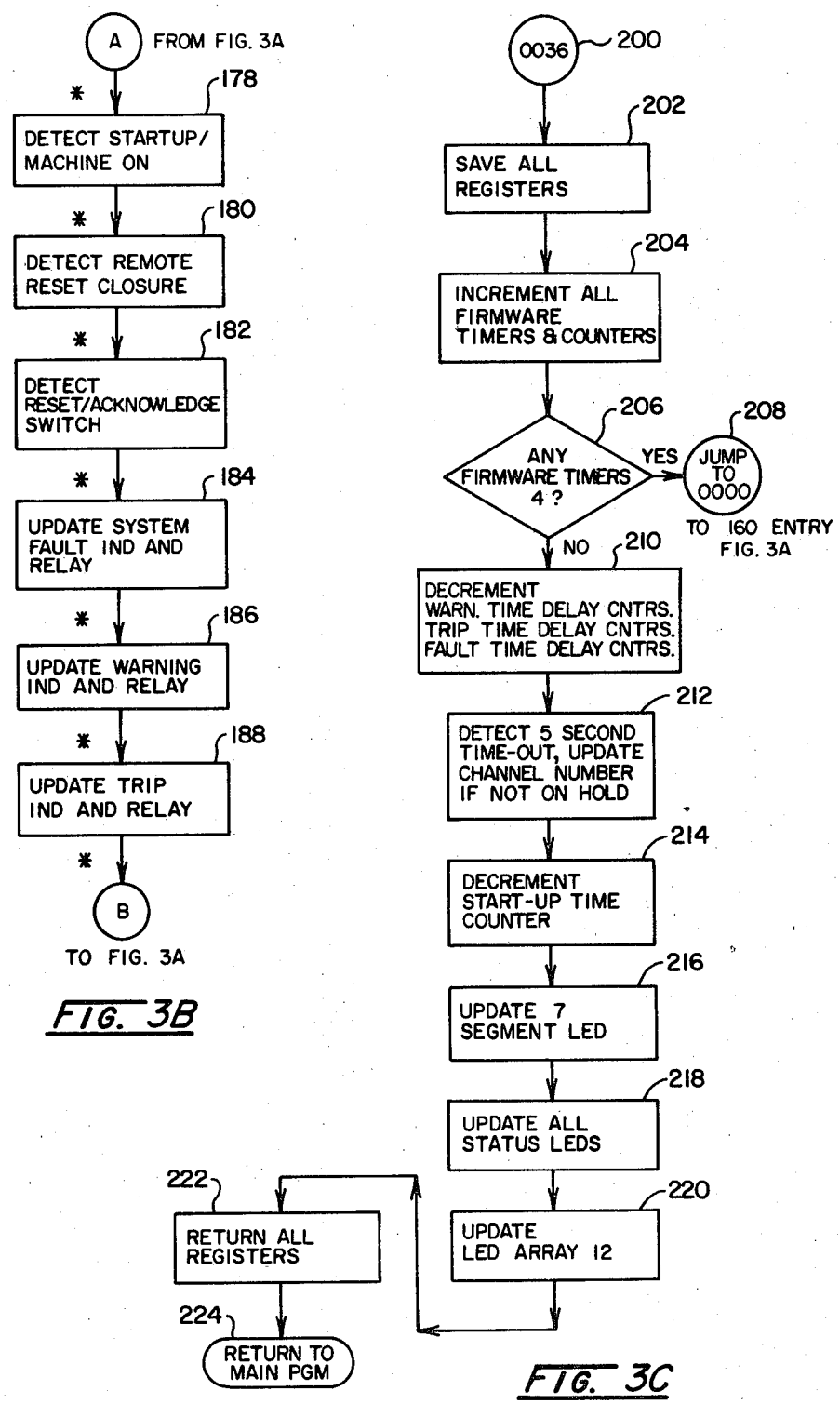

Turning now to FIG. 3A, and FIG. 3B, the microinstructions for carrying out microprocessor 94 operations as retained within ROM 102 are represented in flow chart fashion. The monitoring system, under the control of microprocessor 94, carries out a complete looping including the monitoring and computations or comparisons for each channel in an interval of about 10 milliseconds. This program is represented to commence at enter symbol 160 in FIG. 3A which represents the sending out of a hardware reset signal from the power supply function 144 at the commencement of operation of the device. As represented at block 162, all variables within the system are initiated, i.e. counters and registers within the system are brought to their initial value for program commencement. Following this initiation procedure, as represented at decision block 164, an inquiry is made as to whether RAM 108 is properly formatted. In this regard, a predetermined data pattern is stored in RAM 108, and this pattern then is compared with an identical pattern stored in ROM 102. Should the power to the system be off an excessive length of time, it is possible that the comparison will be negative, and later described corrective procedures will take place. Assuming that the response to the inquiry at block 164 is "yes," then it may be assumed that the RAM memory has retained all set points and like data without error. With such affirmative response, as represented at block 166, a delay of 15 seconds is carried out. This permits the input conditioning networks 84a–84f to "settle out," the d.c. levels generated in connection with such networks being slightly unstable in conjunction with the switching on and off of power. This interval assures their assumption of a stable condition. Following the 15 second delay at block 166, as labeled, the main program commences and, as represented at block 168, in sequence, each of the d.c. signal levels for each channel, as developed at conditioning networks 84a–84f are converted to digital form utilizing the combined multiplexing and A/D conversion function represented at block 92. Additionally, the voltage level derived by the potentiometer or programming component 68 and asserted along line 90 is converted to digital form, assuming that such signal has been presented to the multiplexing function at block 92. Assuming that programmer 60 has been coupled with multiplexing-A/D function 92, then as represented at block 170, the function position to which programmer 60's function switch 66 is located is decoded. Such decoding is carried out in somewhat of a scanned technique, as represented by the array of blocks at 172. In array 172, the earlier described hand-held programmer function numbers again are reproduced along with an identification of their corresponding function. Recall that the entry of information related to the function is dependent, with certain exceptions, upon the actuation of enter switch 70. In the absence of insertion of programmer 60, function number 1 generally will be carried out which is normal operation of the system wherein the vibrational or monitored levels are scanned and compared with setpoints or threshold levels which have been preestablished. Upon progressing through the functions represented at blocks 172, then as represented at block 174, the condition of hold-advance switch 20 is detected. If this switch is in an initial hold condition, then a singular channel will be displayed at indicator 18 and retained until such time as the switch is released or actuated again which will cause the channel numeration to advance one digit. Recall that if switch 20 has not been actuated in either an advance or hold mode, then the channel numeration will increment on a 5 second interval basis. Such timing is carried out utilizing a counter under microprocessor control. From block 174, the program then progresses to block 176 wherein a detection of the first channel to experience a trip condition is made. In effect, the first channel to trip in any sequence is identified and that identification is submitted to a memory location such that the 10 Hz flashing of the channel designation at indicator 18 may be carried out during the course of its display of the tripped channel number.

Looking to FIG. 3B, the program is seen to continue to block 178 at which point a detection is made as to whether the machinery being monitored has started up. This is a detection of the closure of an external switch to carry out such startup. At such time, LED 30 (FIG. 1) is illuminated in steady state fashion, and the gain of amplification stages within all conditioning card stages 84a–84f is attenuated, for example, by a factor of 3 for the interval selected by function 12 of hand-held programmer 60. Recall from FIG. 2, that a signal carrying out the attenuation is one emanating from I/O function block 130 to a common signal conditioning card startup bus. Generally the start-up interval will be selected within an interval of from 0–100 seconds.

The program then progresses to block 180 at which point a determination as to whether an owner provided remote reset procedure has been carried out. This is an option given to the user of the apparatus and emanates from terminal 114 and I/O port 112a. The function carries out a simultaneous acknowledgement and resetting of all channels within the system.

The program then progresses to a detection as to the actuation of Reset-Acknowledge switch 42. As described earlier, depression of switch 42 at a time when a trip or warning condition has been represented at indicators 36 or 38 in flashing form, will cause the pertinent indictor to assume a steady state energization. As represented at block 184, the program then carries out an updating of the system fault relay. In this regard, recall that functions 4 and 9 of hand-held programmer 60 provide for the setting of a high value and low value of output for each transducer. Should the signal level now detected be above or equal to the high value or lower or equal to the low value thus programmed, a radical condition will be represented which is indicated as a fault condition by illumination of the fault LED 28. Where a monitoring transducer is damaged, the resultant output signal may be very low or high. In the latter condition, for example, where thrust is being monitored by a non-contacting transducer which oversees a gap condition, upon the severance of a cable from the transducer, the resultant signal will exceed the high sensor valuation, warning and trip conditions will be indicated in addition to the fault indicator. Upon observing this readout, the operator will immediately know that a radical condition such as a cable severance has occurred. In the event of machinery shutdown occasioned by this form of a trip condition, the operator will know that the shutdown was invalid and will be prepared to restart the machinery forthwith. The term "update" in block 184 as well as in ensuring blocks is utilized inasmuch as the signal value and limit value comparisons associated therewith are carried out at the rapid, 10 ms, rate of the program.

As represented at block 186, the program then carries out an updating of the warning indication and relay function by carrying out a comparison of the immediate channel transducer signal values as converted to digital form with those inserted from programmer 60. Where the limits are exceeded for a high condition or are below a low set point, then appropriate indicators and relays are actuated, such indicators including LEDs 26 and 38 as well as relay 128. (Activation of warning relay 128 generally is utilized to carry out a remote warning signal to the operator or remote management.) As represented at block 188, the program then carries out an update routine with respect to trip levels and, in the event of a transducer output signal having a digitalized value equal to or above a trip limit value equal to or below a programmed low value, trip indicators 24 and 36 are energized on an intermittent basis, and trip relay 126 is activated. The program then returns to position B in FIG. 3A to perform a repetition. A more detailed description of the updating procedures as represented at block 188 and which applies additionally to the routines represented by blocks 184 and 186 is provided later herein in connection with FIGS. 6A and 6B.

Returning to FIG. 3A and decision block 164, generally the earlier described pattern will comprise 16 out of the available 256 memory locations of RAM 108. Should any one of the 8 bits at each such location have been altered, then a negative response is derived from decision block 164. Where this condition obtains, then as represented at block 190, an "E" is intermittently displayed at channel indicator 18. This symbol instructs the operator to "enter" set point data again. From block 190, the program then progresses to decision block 192, whereupon a query is made as to whether connection between connectors 64 or programmer 60 and input connector 50 has been made. In the event of a negative response, the program will continue to loop, as represented at line 194, until such time as the programmer 60 is placed in operational association with the system.

In the event of an affirmative response that the programmer has been inserted, then as represented at block 196, the program initializes a test pattern in RAM 108. Additionally, an initialization of starting set points or limit values is provided. Such set points are permanently provided in ROM 102 and are transferred to RAM. Preferably, the set point selected for this start-up are "off scale" such that they will not be observed within array 12. Their utilization provides a prevention of random placement of set points with the initial turning on of the system. Following the latter initiation, the program then continues to block 168 and continues therefrom as above described. The asterisks represented following numerous of the program blocks described above represent the setting of pertinent timing components within the program to zero valuations. This resetting of such timing functions is further amplified upon in connection with the discussion of FIG. 3C.

Referring to FIG. 3C, a flowchart representing an important interrupt program is revealed. This program interrupts the earlier described main program every 10 ms and, inter alia, serves to very accurately control the flash rates for all LEDs or visual indicators in the system. An accurate control of the flash rates of these indicators is important from the standpoint of assuring confidence on the part of the operator in identifying the meaning of information provided by each such indicator. Timing control utilized by the interrupt program is evolved initially from block 150, the output of which is asserted at microprocessor 94. As will be identified later herein, the program is entered by asserting a "Restart 7.5" signal at the corresponding terminal of microprocessor 94 on a 10 ms frequency basis. This entry is represented in the drawing at 200. Upon entry, as represented at block 202, all registers within microprocessor 94 are saved or preserved inasmuch as the main program will be reentered following completion of the instant interrupt program.

The program then progresses to block 204 at which point all timers and counters as described by the asterisks in connection with FIGS. 3A and 3B are incremented by 1. At decision block 206, the query is made as to whether any timers have reached a "4" value. This procedure provides a diagnostic evaluation of the ongoing program. For example, if the main program timers have not been set to 0, where such timers have been incremented to a value of 4, then as represented at terminal 208, the program is returned to initiation at entry symbol 160 (FIG. 3A).

In the event the query at block 206 is negative, the interrupt program proceeds to block 210 at which point the time delay counters are decremented, those counters being associated with the warning, trip and, if desired, fault functions in accordance with information or data supplied by the hand-held programmer 60 or permanently inserted in ROM 102. The program then progresses to block 212 at which location the 5 second timeout for displaying a channel number at indicator 18 is made, and following such timeout, the channel number is updated under the condition that the hold function derived from switch 20 is not in effect. Following this procedure, as represented at block 214, the startup time counter is decremented. It may be recalled that this counter receives a valuation in accordance with function 12 of function switch 66. The next step in the program is represented at block 216 at which position the 7 segment LED formed within indicator 18 is updated. In this regard, in the event a next number or symbol is required, this block sees to the carrying out of such alteration. Looking to the next step in the program at block 218, all status LEDs or indicators are updated to reflect proper program conditions. These status LEDs have been described in general at 22 and 34 in FIGS. 1 and 2.

Block 220 reveals that the next step in the program is the updating of LED array 12. This updating is carried out at a clock-defined rate of 50 Hz with respect to the monitored values deriving from the transducers and thus the energization of pertinent LEDs within array 12 appears steady state. From block 220, the program progresses to block 222, wherein all registers are returned and as represented at terminal 224, the main program, as represented at FIGS. 3A and 3B, is resumed.

As indicated earlier herein, the interrupt program represented by FIG. 3C, is one which regularly occurs each 10 ms. Looking momentarily to FIG. 4, a timing diagram describing the techniques for evolving the accurate flashing rates from the interrupt program is set forth. The timing diagram is evolved from the combined operation of clock 150 with microprocessor 94. In effect, the clock function 150 provides 10 ms intervals to microprocessor 94 which are monitored in a counter within RAM function 108 to derive, for the instant embodiments, eight indicator energization states. The 50 Hz rate is labeled "monitored level" and defines the 20 ms pulse interval used for the program of FIG. 3C. The noted counter in RAM 108 defines the eight states, and for each even representation thereof, an energization of a monitored level LED within array 12 takes place. The four setpoint or threshold level LEDs as above described are energized at a 12.5 Hz rate on a sequential basis as represented by the remaining labeled curves. For example, during the first 10 ms, the monitored level LED is displayed within array 12; next, for 10 ms, one set point or threshold level LED within that array, for example, the trip high level is displayed, following which the monitored level again is displayed. As represented in the diagram this condition carries on to define eight states within the noted RAM counter to provide a flickering, 12.5 Hz indication of threshold levels and an apparent steady state indication of monitored levels. A similar arrangement is provided for accurately, intermittently energizing appropriate ones of the status indicators represented generally at 22 and 34.

Figure 5:
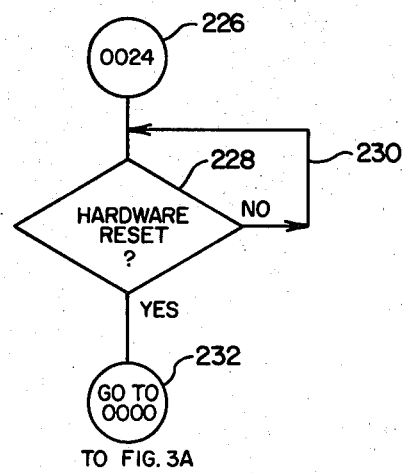
FIG. 5 is a flowchart describing a minor routine of microinstructions of the instant apparatus.

Turning to FIG. 5, a subroutine is revealed which responds to a Trap signal at line 148 emanating from power loss detector function 146 (FIG. 2). The Trap signal occurs upon the prediction by power loss detector 146 that an a.c. power loss or d.c. level voltage failure is underway. This provides for entry, as represented at terminal 226, into the trap function. From entry at 226, as represented at decision block 228, a query is made as to whether a hardware Reset signal has been received, for example from along line 150 in FIG. 2. In the event a negative response obtains, then as represented at loop line 230, the program awaits such signal. The Reset signal will occur 250 microseconds following the occurrence of the Trap signal. Accordingly, with an affirmative response at block 228, as represented at terminal 232, the program returns to entry terminal 160 (FIG. 3A).

As indicated earlier herein, the update functions represented at block 184, 186 and 188, carry out the control over relays and status output indication, all operating in somewhat similar fashion. Looking to FIGS. 6A and 6B, a flowchart representing a typical such subroutine is revealed, the trip relay update routine represented in FIG. 3B at block 188 being selected for this purpose. In the figure, the subroutine is shown to commence at terminal 240, following which, as represented at block 242, certain locations in RAM 108 are initialized. As represented in the block, typical of such initializations are the SETWRD established at hexadecimal 44 which provides a flasher flag and a trip flag bit presentation. Also shown is a reset word which is the opposite of the flasher and trip flag orientations. Next, the high set point and low set point locations are initialized. In the latter regard, the high set point (HISPT) is identified as a channel 1 trip high (CH1TH). Similarly, the low set point word is identified as channel 1 trip low (CH1TL).

Looking to block 244, the counter address is positioned to the address of channel 1 trip delay counter whose value is counted down to zero in 0.2 second increments under a trip condition. Similarly, the trip delay address is positioned to the address of the channel 1 trip delay time. The trip delay time is transferred to the channel trip delay counter when a trip occurs. From block 244, the subroutine progresses to decision block 246 wherein the query is made as to whether a trip relay lockout function (switch 66 function position 2) has been entered. In the event of an affirmative response, then as represented at block 248, a subroutine is entered into wherein the energization of trip delay 126 is prohibited. Entitled "reset six status words" (RS6STA), the subroutine provides for the resetting of all trip and flasher flags as well as the resetting of all counter set flags. Following this subroutine, as represented at terminal 250, a return to the main program for a continuance thereof is carried out.

Figure 6A:
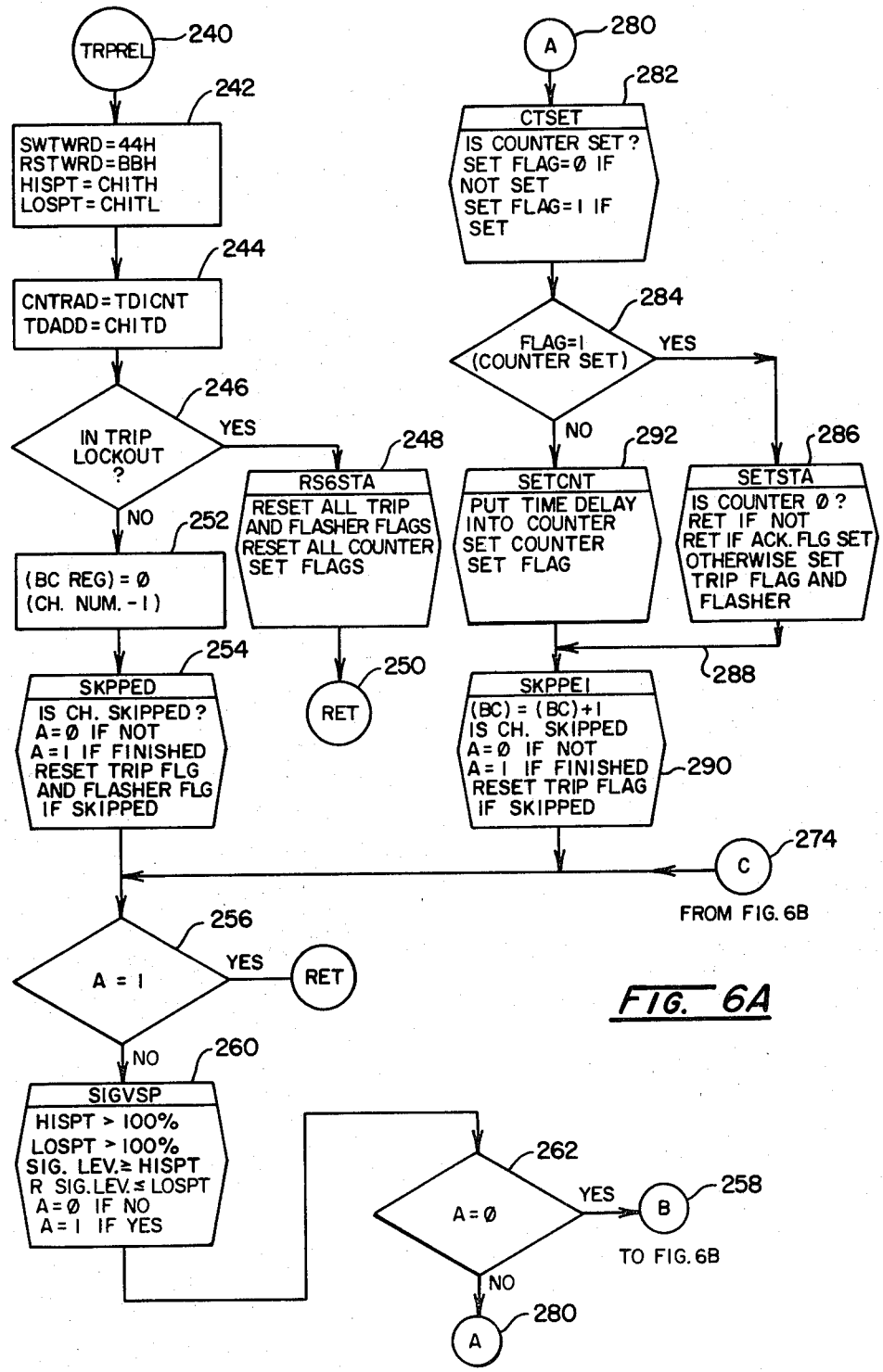

In the event the query at decision block 246 is negative, then as represented at block 252, the system will operate trip conditions in a normal manner. Accordingly, as represented at block 252, a register within microprocessor 94 designated "BC" is set to 0 when considering the initial channel. This register is set to the channel number minus 1. Upon setting the BC register, the program progresses to subroutine 254 wherein the channel identified at block 252 is checked to determine whether or not it has been designated as one which should be skipped, as represented by function 14 of programmer 60 switch 66. If the channel in question is not skipped, then the A register of the microprocessor 94 is set to zero, and if all channels have been checked, that register is set to one. In the event that a channel has been skipped, then the trip flag and flasher flag are reset with respect to that channel. Looking to decision block 256, if the above noted A register has been set to 1, an indication that all channels have been checked is present, and the resultant affirmative response provides for a return to the main program as represented at terminal 258. In the event of a negative response at block 256, then as represented at subroutine 260 the threshold levels or set points are compared with the signals emanating ultimately from the pertinent channel transducer. Where the values representing the set points are greater than scale or 100 percent, then they are considered to be deleted. Next, the subroutine queries whether the monitored signal value is greater than or equal to the preestablished high set point, or the comparison is made as to whether the signal level is less than or equal to the low set point or threshold value. In the event that the answer is "no," then the A register is set to 0 and, conversely, if the answer is affirmative, then that register is set to a 1. The program then progresses to decision block 262 querying whether the A register has been set to 0. In the event of an affirmative response representing the absence of a trip condition, then as represented at terminal 264, the program progresses to block 266 as represented in FIG. 6B. Referring to that figure, block 266 reveals that in the event of no trip conditions, the acknowledge flag is reset. Recall that the acknowledgement is carried out by the operator with the actuation of switch 42. From block 266, the program then progresses to decision block 268 wherein the query is made as to whether the flag which causes the trip LEDs 24 or 38 to flash is set. In the event of an affirmative response, such LEDs are flashing and, as represented by loop line 270, the program progresses to subroutine 272 representing a portion of the skip routine. As labeled within block 272, the BC register described in connection with block 252 is incremented by 1 indicating a progression to the next sequential channel to be considered. The subroutine further determines whether that channel has been skipped. The A register is set to 0 if that is not the case and to a 1 value in the event of a completion of a consideration of all channels. Additionally, the trip flag is reset if the channel in question has been skipped. As indicated by terminal 274, the program then returns to the corresponding point indicated in FIG. 6A to be repeated.

In the event of a negative response at decision block 268, then as represented at block 276 a somewhat redundant reset status (RSTSTA) subroutine is carried out wherein the trip flag and flasher flags are reset. From subroutine 276, the program then progresses to a reset flag (RSTFLG) subroutine represented at block 278. This subroutine serves to reset a counter set flag which provides a system indication that the counter, which provides the trip delay in carrying out a trip activation as represented by function 10 (supra) has already been inserted for potential countdown under the interrupt service routine represented by the flowchart of FIG. 3C. A reset is carried out, inasmuch as no trip condition exists for this leg of the flowchart. From block 278, the program progresses through block 272 and terminal 274 to return to FIG. 6A as indicated and to decision block 256 wherein the query as to whether the instant subprogram has been completed or not is made. If not, continued channel dependent operation ensues.

Where a set point or threshold level has been reached, then as represented again at decision block 262, a negative response provides an indication that a trip condition has occurred. In this instance, as represented at terminal 280, the program progresses to a counterset subroutine (CTSET). The initial operation carried out in the subroutine queries whether the earlier described function 10 delay counter has been set, i.e. has the time delay been transferred which pertains to that particular channel. If that counter has been set, then the corresponding set flag is set to 1 and, conversely, the set flag is set to 0 if the counter has not been set. The program then progresses to decision block 284 at which point the query is made as to whether the above-noted flag discussed in connection with subroutine block 282 has been set. In the event of an affirmative response, the program then merely is awaiting the completion of a trip time delay countdown. Accordingly, within this set status subroutine (SETSTA), the question is made as to whether the counter is at a 0 position and in the event it is not, then the program continues as indicated along line 288. Another function within subroutine 286 provides the same form of routine as through line 288 if the acknowledge flag has been set. If the acknowledge flag for the pertinent channel has not been set, then it is necessary to carry out instructions to cause the activation of appropriate trip LEDs as at 36 and 26 to flash. Accordingly, the instructions provide for the setting of the trip flag and flasher flag. Also, the trip relay as described at 126 in FIG. 2 will be activated. From block 286 and line 288, the program then progresses to carry out the earlier described SKPPE1 subroutine as discussed in conjunction with block 272. In this instance, the BC register is incremented by 1, a query is made as to whether that channel is skipped, the A register is adjusted accordingly and the reset trip flag operation is carried out if it has been skipped. At this juncture, additionally, the BC register may be incremented once again to progress to the next succeeding channel.

The program then continues as described above to decision block 256 to determine whether all channels have been considered.

Returning to decision block 284, in the event that the trip delay counter has not been set, then the program progresses to a set counter subroutine (SETCNT) as represented at block 292. At this subroutine, the predetermined channel designated time delay is inserted in the counter, and the counter set flag is set. The program then progresses, as before, through block 290 and into decision block 256. It should be noted that a system status is determined with each cycling through the above-described program to carry out the appropriate activation of the indicators generally represented at 22. The latter status as well as an updating of the trip relay 128 is carried out in conjunction with the subroutine represented at block 184 in FIG. 3B.

The hardware implementation of the above-described system and apparatus is set forth in the discourse to follow. Where appropriate, the same numeration identifying components earlier described in a general manner is retained in the figures to follow. Power inputs within the circuit illustrations are shown as voltage levels deriving in general from a power supply described at block 144, while ground components are represented, where appropriate, with alphabetical designations D, L, S and P representing, respectively, digital ground, LED ground, signal ground and power ground in accordance with conventional practice.

Referring to FIG. 7, a diagram is revealed showing the physical orientation appropriate for providing a simultaneous consideration of FIGS. 8A–8D.

Figure 8A:
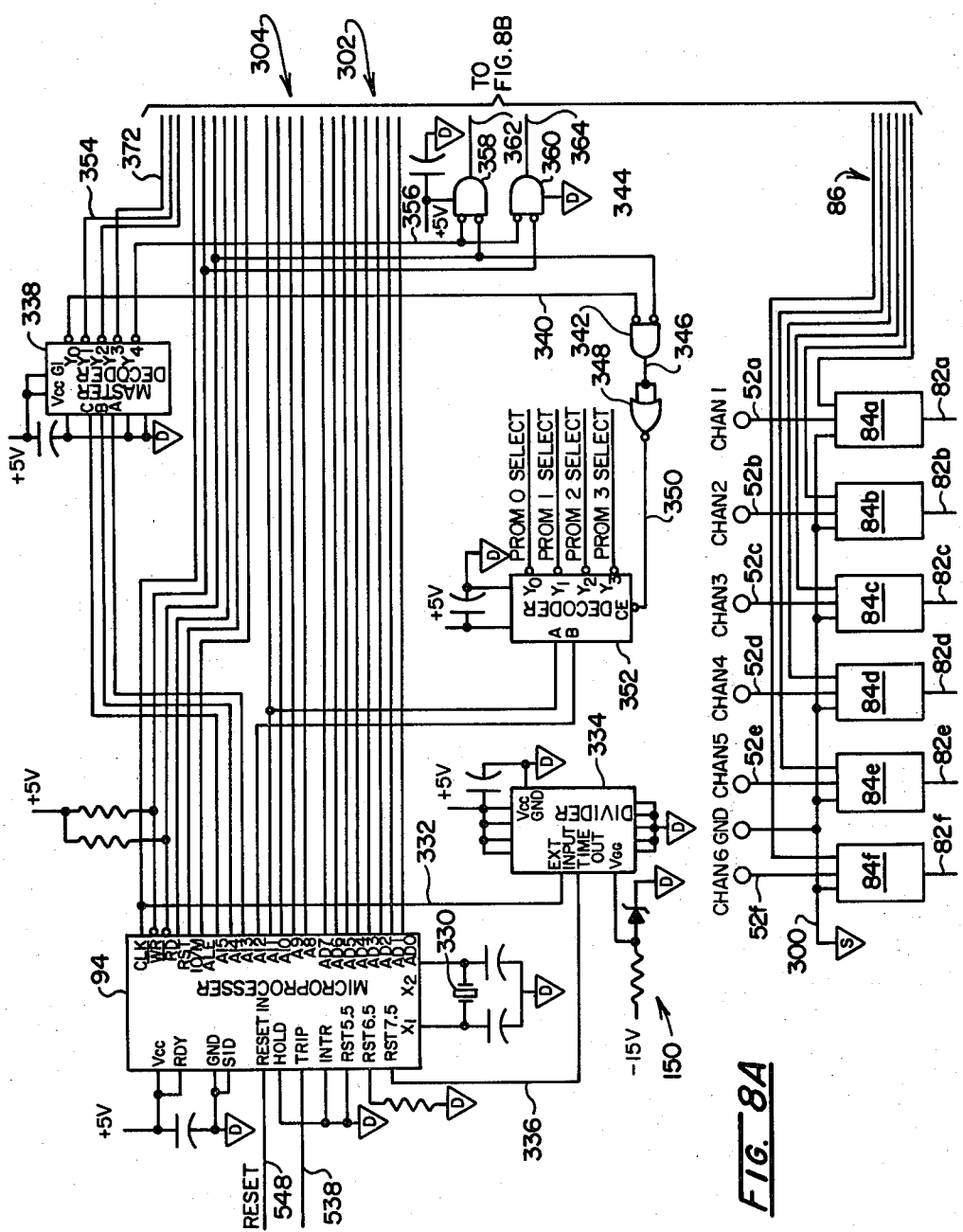

Referring to FIG. 8A, the signal conditioning cards or networks described in conjunction with FIG. 2 again are reproduced as blocks 84a–84f. Signal ground outputs for these networks are derived from along line 300, while the transducer cable inputs thereto again are represented at 82a–82f as earlier presented in connection with FIG. 2. The individual outputs of conditioner networks 84a–84f have been described earlier and are grouped in FIG. 8A under the numerical designation 86. Each of these lines 86 carries a d.c. signal proportioned with the outputs of the corresponding channel transducers. Looking additionally to FIG. 8B lines 86 are shown being directed to the analog inputs of a Data Acquisition Component 92. Component 92 may be present as a single chip data acquisition system, for example of a type ADC0817CCN marketed by National Semiconductor Corporation. These components are monolithic CMOS devices with an 8-bit analog-to-digital converter as well as a multi-channel multiplexer and microprocessor compatible control logic. At six of these analog input ports, the analog d.c. signals from line 86 are individually selected and each so selected is converted to a corresponding binary digital form and are outputed, as labeled, through data bus ports for transmittal by an address data bus, the eight discrete leads of which are generally identified at 302. Looking additionally to FIG. 8A, it may be observed that the leads of address data bus 302 extend to the AD0–AD7 ports of microprocessor 94. Microprocessor 94, for example, may be present as a single chip 8-bit N-channel microprocessor type 8085 marketed by Intel Corporation. Control over data acquisition component 92 from the microprocessor 94 is derived from ports A8–A11 which are coupled through leads represented generally at 304 to the A, B, C and D input ports of the latter. These ports receive appropriate signals designating that channel to be selected for carrying out an analog to digital conversion. Once so converted, microprocessor 94 effects the submittal of such data along bus 302 to random access memory (RAM) 108.

Data submitted to the acquisition network 92 along leads 86 may derive from a defective conditioning network 84a–84f, and thus protection is provided by an array of clamp diodes represented within boundaries 306 and 308. These diodes, functioning in conjunction with respective voltage reference amplification stages 310 and 312, assure that the voltages at any line of grouping 86 remain within predetermined upper and lower limits. For example, by appropriate adjustment of variable resistance 313, the output of the operational amplifier within stage 310 may be retained, for example, at 0.3 volts. Thus, should the voltage at a lead within grouping 86 tend to a lower value, then the appropriate diode will be forward biased to clamp the voltage at about 0.7 volts less than the preselected 0.3 volt value. Similarly, the variable resistor 315 of stage 312 may be adjusted such that the output may, for example, have a value of about 4.6 v. Thus, should a voltage within a given line of grouping 86 tend to go higher, the appropriate diode will be forward biased to clamp the voltage at the appropriate line at the limiting level, about 0.7 volt level above the output voltage of stage 312.

In the course of the multiplexing operation of data acquisition network 92, the multiplexed signal selected for conversion to digital form is calibrated within network 98. In this regard, the selected signal is outputted from the MUX O port thereof along line 314. This line leads through a resistor to the positive input of operational amplifier 316 which is configured (including its input network) to provide a gain of less than 1, to reduce signal level, null offset and improve load impedance and source impedance relationships with converter 92. The thus treated signal is returned along line 318 to the COM I or common input port of network 92. Because the analog to digital components of network 92 require a precise reference voltage input, a voltage reference network represented at block 320 is provided, the block having a scale adjustment at variable resistor 321 and operating in conjunction with the labeled +15 v input. Voltage reference network 320, for example, may be present as a type MC1404 marketed by Motorola, Inc. The regulated output of network 320 is presented along line 322 to the input of a buffer amplifier stage and the thus buffered reference voltage is presented to network 92 from along line 326. Note that line 322 is tapped at line 328 to provide a reference input to stage 316 through a combined variable resistance and divider network.

Returning to FIG. 8A, the clock function of the system is revealed in general at 150. This clock comprises a 2.0 MHz crystal oscillator 330 which is coupled to the X1 and X2 input terminals of microprocessor 94. Microprocessor 94, in turn, converts this signal to a 1 MHz signal at its clock (CLK) output terminal which is tapped at line 332 for assertion at the input terminal of a divider network 334. Network 334, may, for example, be present as a counter time-based circuit, type MK5009 marketed by Mostek, Inc. The output of divider network 334 is present at line 336 as a 100 Hz signal which is directed to the restart (RST 7.5) input of microprocessor 94. It may be recalled that this signal is utilized in conjunction with the restart timing program described above in conjunction with FIGS. 3C and 4 for deriving very accurate flash rates for all of the visual indications provided for the system.

Control signals particularly associated with the ROM 102 and RAM 108 memory functions are derived at microprocessor 94 at the read ($\overline{RD}$) terminal, a low level originating thereat indicating that a selected memory or I/O device is to be read and that the data bus is available for transfer; a write control ($\overline{WR}$), a low level on $\overline{WR}$ indicating that the data on the data bus is to be written into selected memory or an appropriate I/O location; the cycle status terminal (IO/$\overline{M}$) having a low output if data is being acquired from or sent to memory or a high output if data are being acquired from or sent to an I/O device; and the address latch enable (ALE) functioning to signal when the moment occurs when the address is to be used by the latches of addressed devices.

Component selection within the system is facilitated through the use of a master decoder 338 which, for example, may be present as a type 74LS138 marketed by National Semiconductor Corp. The decoder serves to decode one of the five lines at its output terminals Y0–Y4 based upon the conditions at the three binary select inputs thereto provided at input terminals A, B and C thereof. These terminals, respectively, are coupled with the A13–A15 terminals of microprocessor 94. The Y0 output of decoder 338 is utilized in one aspect of selecting the ROM 102 function and is shown coupled through line 340 to one inverting input of AND gate 342. The opposite input to gate 342 at line 344 is derived from the read ($\overline{RD}$) terminal of microprocessor 94. The output of gate 342 at line 346 is inverted at gate 348 and directed along line 350 to the enable terminal (CE) of another decoder 352. Decoder 352 may, for example, be present as a type 74LS139 marketed by National Semiconductor Corp. This decoder responds to control inputs at its A and B terminals extending respectively to the A11 and A12 terminals of microprocessor 94, as well as to the enablement input at line 350 to provide for the decoding of ROM function 102 selection lines at terminals Y0–Y3. The lines coupled with these outputs are labeled PROM 0 select through PROM 3 select and are discussed in more detail later herein.

The RAM function 108 selection output of master decoder 338 is provided from the Y1 terminal thereof at line 354 and is labeled "RAM SELECT."

An analog to digital function selection is developed from the Y4 terminal of decoder 338. In this regard, terminal Y4 thereof is coupled through line 356 to one inverting input of AND gate 358 as well as a corresponding input to AND gate 360. The second inverting input to gate 358 is derived from the read ($\overline{RD}$) terminal of microprocessor 94, while the corresponding second input to gate 360 is derived from the write ($\overline{WR}$) terminal thereof. Data acquisition network 92 is controlled by the outputs of gates 358 and 360, a line 362 coupling the output of gate 358 with the tristate input of network 92 and line 364 coupling the output of gate 360 with the START terminal thereof. For analog to digital conversion at network 92, two general procedures are carried out, first the conversion is commenced, and secondly, the converted and digitized number is read. The sequential functions are carried in conjunction with appropriate signals from lines 362 and 364 in addition to a synchronizing clock input deriving from line 366 as shown in FIG. 8B. This clock input is one of a slower rate for purposes of A/D conversion. Turning to that figure, it may be observed that line 366 extends between the clock (CLK) terminal of network 92 and the CLK 0 terminal of input-output network 112. Network 112 may be present, for example, as a type 8155 large scale integration device as marketed by Intel Corporation. The input and output ports thereof are operable in accordance with a self-contained program operating in conjunction with its association with address data bus 302 and the microprocessor clock (CLK) output as directed to the CLK$_1$ terminal thereof. Additionally, network 112 responds to the read and write commands of microprocessor 94 by connection between the corresponding $\overline{RD}$ and $\overline{WR}$ terminals of the components. The chip select terminal ($\overline{CS}$) is coupled with terminal Y2 of master decoder 338, while the reset (RST), IO/$\overline{M}$ and address latch enable (ALE) terminals of network 112 and microprocessor 94 are mutually interconnected.

Inputs to network 112 include those labeled "WARN" and "TRIP" at port C thereof, which inputs are derived from monitoring components of corresponding warning and trip relays 128 and 126. These inputs are signals representing a malfunctioning relay which will cause a fault indication. The "REMOTE RESET" input to port C is an optional arrangement for the system as described above wherein the operator may acknowledge and reset the the warning and trip relays from a remote location. Looking to port A of network 112, the signal responding to the commencement of energization of the machinery being monitored is labeled "START UP" and derives from such machinery to commence the carrying out of the above-described startup time interval and simultaneous suppression of monitoring signals. The remaining inputs to port A are of a switched nature, utilizing a positive voltage input derived from an array of resistors shown within boundary 368 which are coupled, as labeled, to +5 v from the power supply of the system. The switched inputs include the earlier described Hold-Advance switch 20 as well as the Reset-Acknowledge switch 42. Additionally, inputs are provided from the condition of function select switch 66 and enter switch 70 of hand-held programmer 60, the coupling thereof being through connector 50 as discussed in conjunction with corresponding connector 64 and the discourse concerning FIG. 1. As discussed earlier herein, the programmer 60 has no self-contained power supply, the switching components thereof operating with the power inputs deriving from resistor array 368. This feature avoids the necessity of incorporating batteries or providing a bulksome power supply with the programmer itself. The output of programming component 68, which may be present as a potentiometer, is again represented at line 90 extending from connector 50. The power input to line 90 is shown deriving from a +15 v supply through resistor 370 and extending to one input port of Analog to Digital converter and Multiplexer network 92. Note in this regard that the signal at line 90 is treated in identical fashion as any one of the channel inputs emanating from line grouping 86 including signal limiting by networks 306, 308, 310 and 312. Thus, a singular multiplexer and digital converter function is utilized both for the programming input and for the monitoring input. This arrangement enhances the considerable simplicity of hand-held programmer 60.

Figure 8C:
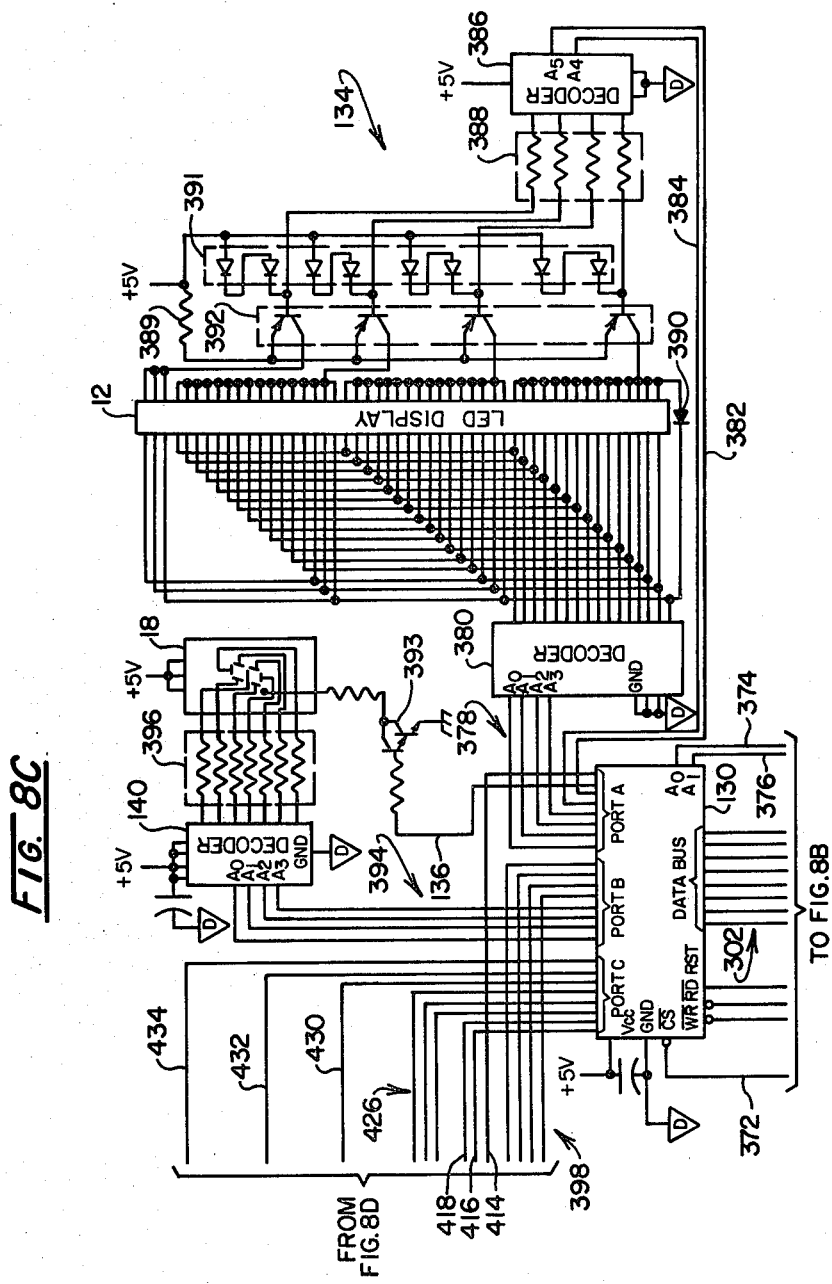

Looking to FIGS. 8A and 8C, it may be observed that the Y3 output terminal of master decoder 338 is connected through line 372 to the chip select ($\overline{CS}$) of another programmable input-output network 130. Network 130 may be a programmable peripheral interface device, for example, as marketed as a type 8255 by Intel Corporation. The inputs to network 130 are coupled to address-data bus 302 as well as the $\overline{WR}$, $\overline{RD}$ and RST terminals of microprocessor 94. Further, the A0 and A1 inputs thereto are connected, respectively, through lines 374 and 376 to the corresponding A0 and A1 leads of a memory associated latched address bus described in connection with FIGS. 9A and 9B. Four output leads designated generally at 378 extend from port A of network 130 to the A0,A3 input terminals of a decoder 380. Decoder 380 may be present as a four line to sixteen line variety marketed, for example, as a type 74159 by National Semiconductor Corporation. The decoder 380 operates in conjunction with a grouping of five, ten element linear LED display modules represented generally at block 12. The decoder selects which of a given 16 LEDs thereof to turn on for each block. Lines 382 and 384 extending from port A of network 130 are directed to the respective A4 and A5 input ports of another decoder 386 which may be of a type 74LS139 marketed by National Semiconductor Corporation. Decoder 386 provides a 2-line to 4-line decoding function. The decoder functions to select which of the above-noted groups of 16 LEDs contains the LED to b energized at any given moment. These LED display modules may, for example, be type RGB-1000 marketed by Litronix, Inc. The output of decoder 386 extends through an array of base resistors represented within boundary 388, diode array 391 and associated driver array 392 to the individual modules within LED display 12. A resistor 389 is provided having a resistance value selected for controlling the light intensity of energized individual LEDs. One additional LED is represented at 390 as being connected with decoder 380 as well as driver arrangement 392. This LED is the 0 level one of the array 12.

Line 136, extending from port A of network 130, is shown coupled through a driver 393 present as a Darlington coupled transistor pair and an illuminational control resistor to the decimal point of channel indicator 18. The decimal point of indicator 18 is illuminated in the event that the channel indicated on display 18 is one which the operator has programmed to skip as determined from function 14 of programmer 60.

Line grouping 394, extending from port B of network 130, leads to the A0–A3 inputs of a 4-line to 7-line decoding network 140. The decoder 140 may, for example, be provided as a type 74LS47 marketed by National Semiconductor Corp. The output of decoder 140 extends through an array of resistors within boundary 396 to corresponding LED segments within indicator 18. Resistors 396 are selected having impedance values controlling the illuminational intensity of the segments of indicator 18.

Figure 4:
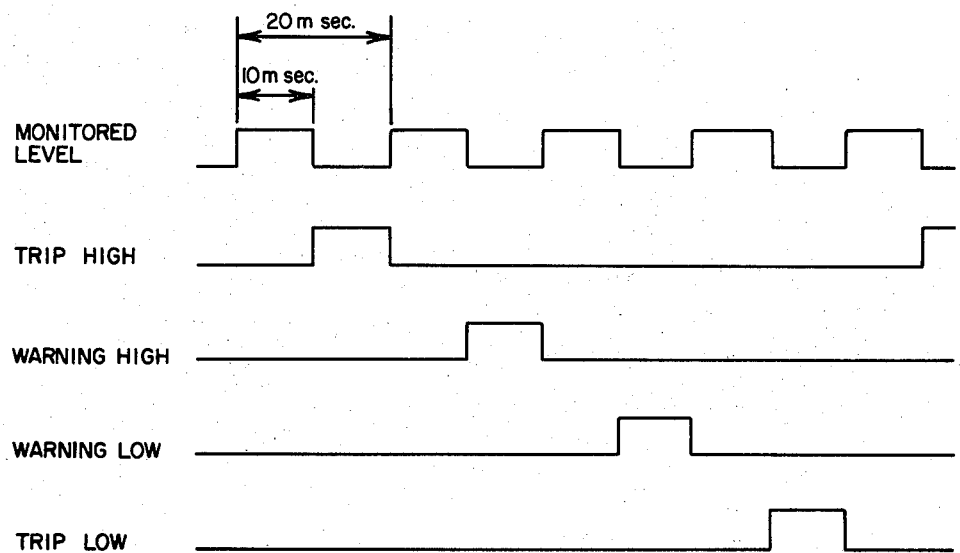
FIG. 4 is a timing diagram utilized in conjunction with the description of FIG. 3C.

Looking to FIGS. 8C and 8D, 4-line grouping 398 is shown extending from port B of network 130 to connection with a driver network within boundary 400, the network being comprised of four monolithic Darlington coupled transistor pairs. The uppermost output from drive function 400 at line 402 provides an actuating signal serving to energize trip relay 126. Line 404 similarly extends to energize the coil of warning relay 128, and line 406 serves to energize the winding of fault relay 142. Line 408, extending from driver grouping 400, is coupled with the base of PNP transistor 410 to turn the latter on and provide an appropriate signal output to start up bus lead 412. Lead 412 serves to carry out the earlier noted suppression of the level of output of conditioner networks 84a–84f.

Line 414 from port A and lines 416 and 418 from port C of network 130 extend to monolithic Darlington coupled transistors within an array defined by boundary 422. Thus arranged, line 418 serves to control the channel warning indicator LED 38; line 416 serves to selectively effect the energization of channel fault indicator LED 40; and line 414 serves to selectively effect the energization of hold indicator LED 42. It may be observed that power selectively is supplied to these LEDs from a 24 v source represented at line 424.

The lines within a grouping thereof at 426 are shown extending from port C of network 130 to Darlington coupled transistor drivers within boundary 428. From the drivers within boundary 428 it may be observed that start-up indicator LED 30, trip lockout LED indicator 32 and channel trip indicator LED 36 are selectively energized. Note that the power supply to these LEDs derives, as before, from line 424. In similar fashion, lines 430, 432 and 434 extend from port C of network 130 to connection with Darlington coupled transistor drivers within boundary 436 for purposes of effecting the energization of system trip indicator LED 24, system warning indicator LED 26 and system fault indicator LED 28.

Figure 9B:
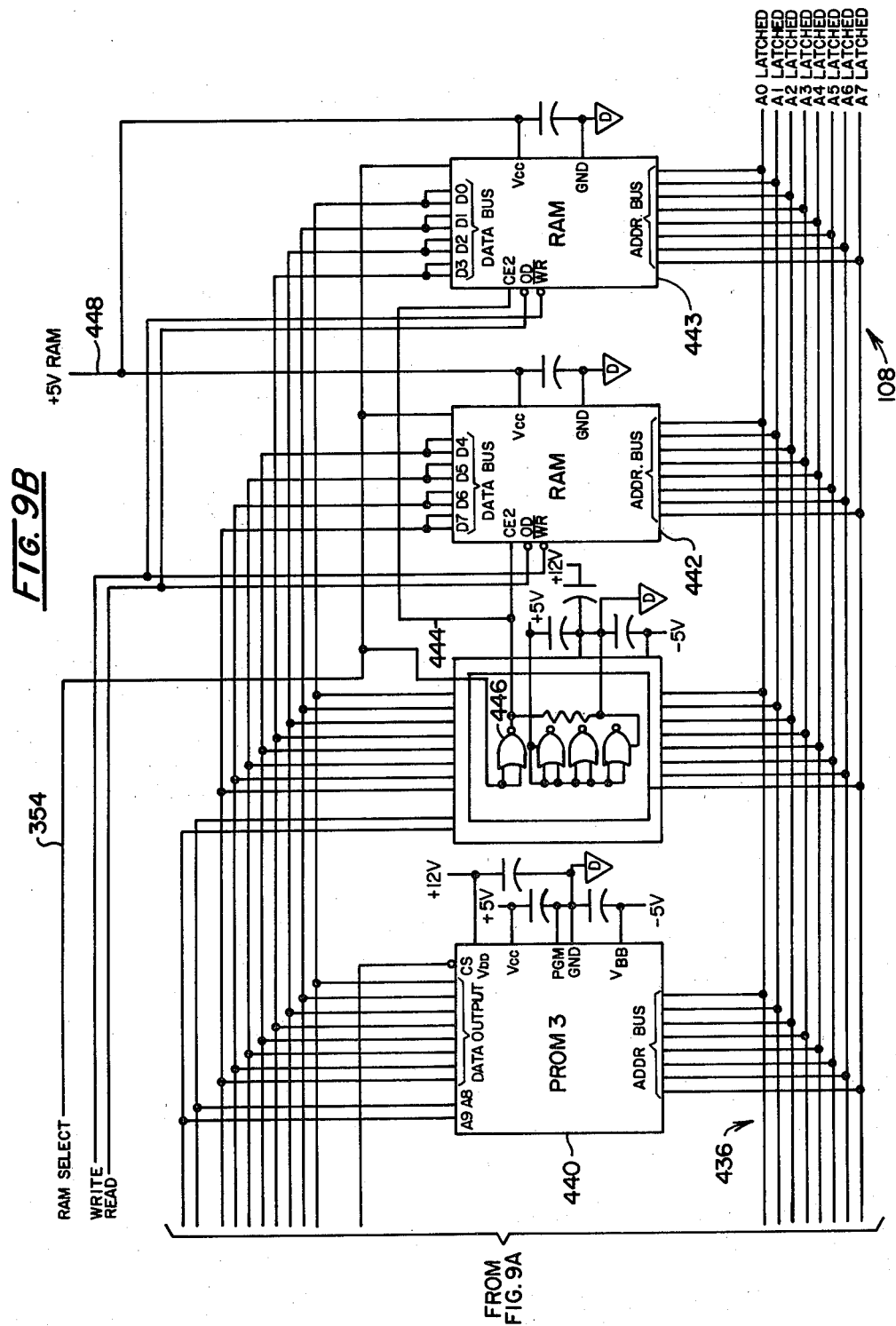

Referring to FIGS. 9A and 9B, memory functions 102 and 108 are revealed in detail. In FIG. 9A address latch 106 is revealed coupled with the address data bus 302. Latch network 106 may be present as an 8-bit input/output port comprising an 8-bit latch with 3-state buffers along with control device selection logic. Such networks, for example, are marketed by Intel Corporation, as a type 8212. Latching control to network 106 is derived from the address latch enable (ALE) port of microprocessor 94 which, as labeled, is coupled with the DS2 terminal thereof. The network 106 is utilized inasmuch as address data bus 302 has an obvious dual function. The latched output of network 106 is provided at address bus 436. Note, that the individual leads of bus 436 are labeled as A0 LATCHED-A7 LATCHED.

Memory function 102 is comprised of three 1K×8 UV erasable PROMS which are 8,192-bit ultraviolet light erasable and electrically reprogrammable EPROMS identified at 438-440 and labeled "PROM 0-PROM 2." The chip select (CS) terminals of each are repectively coupled with decoder 352 (FIG. 8A) through lines correspondingly labeled "PROM 0 SELECT-PROM 2 SELECT." Additionally, the A8 and A9 terminals of microprocessor 94 are coupled in common with the correspondingly labeled terminals of PROMS 438-440.

Looking in particular to FIG. 9B, the RAM function 108 is shown to comprise two 256×4 bit static CMOS RAMS 442 and 443. These components, for example, may be of type 5101L marketed by Intel Corp. Enablement for either reading or writing with respect to RAMS 442 and 443 is derived from RAM SELECT line 354 emanating from master decoder terminal Y1 (FIG. 8A). With respect to the noted read or write command, lines labeled "WRITE" and "READ" extend from respective $\overline{WR}$ and $\overline{RD}$ terminals of microprocessor 94 to the OD and $\overline{WR}$ terminals of RAM components 442 and 443. The chip select function simultaneously applied to RAMS 442 and 443 is at their CE 2 terminal inputs and is derived from line 444 extending from a two input NOR gate 446. The inputs to gate 446 derive from line 354 which, as indicated earlier herein, provides a RAM select function. The use of such a gate provides a redundant RAM function selection assuring that both memory circuits are active in order to permit the selection of a RAM function. Power to RAMS 442 and 443 is derived from line 448 extending from power supply function 144. This power supply will be seen to accommodate for power outages to an extent assuring that data is saved within RAMS 442 and 443.

Referring to FIGS. 10A and 10B, the power supply described earlier in conjunction with block 144 in FIG. 2 is shown in enhanced detail. The a.c. line input power represented generally at 450 is shown coupled to the primary windings of a power transformer 452. Transformer 452 includes a first secondary winding 454 which is rectified at bridge 456 to provide an unregulated 24 volts at line 458. Additionally, a line 460 extending from bridge 456 incorporates a regulator 462 to provide a regulated +24 v at line 464. The center of secondary winding 454 is tapped by line 466 to provide power ground and LED ground, while the opposite side of bridge 456 is coupled by line 468 to another regulator 470. Regulator 470 provides a −24 v power source at line 472.

In similar fashion, transformer 452 incorporates another secondary winding 474, the a.c. output of which is rectified at bridge 476. One output of bridge 476 is coupled by line 478 to a regulator 480 to provide a +15 v power source at line 482. Similarly, the opposite side of bridge 476 is coupled by line 484 to a regulator 486 to provide a −15 v power source at line 488. The center of secondary winding 474 is tapped by line 490 to provide signal ground. Another secondary winding 492 of transformer 452 is coupled with a bridge rectifier 494. One side of regulator 494 is coupled by line 496 to a regulator 498, the output of which provides a +5 v power source at line 500. The opposite side of bridge 494 is coupled by line 504 to line 496 through capacitor 506, and line 504, in turn, is coupled to line 508 to provide digital ground.

The opposite sides of winding 474 are coupled by lines 510 and 512 to respective diodes 514 and 516 which serve a rectification function. In this regard, the cathode of diode 516 is coupled to line 518, coupled in turn to the cathode of diode 514. Line 518 extends through a voltage dividing network including resistors 520 and 522 to the under voltage sense (UVSENSE) terminal of a power supply output supervisory circuit 524. The ground input to circuit 524 is coupled by line 526 to ground and a Zener diode 528 and resistor 520 are coupled between lines 518 and 526 to protect circuit 524 from excessive voltage excursions. Circuit 524, may, for example, be present as a type SG3543J marketed by Silicon General, Inc. In the event of an a.c. power loss, circuit 524 will generate an undervoltage indicate signal at line 530. A pullup resistor 532 is coupled to +5 v voltage supply and line 530 and the latter is coupled to the trigger input of a timing circuit 534 which develops a 24 ms pulse at line 536 in response thereto. Line 536 is coupled to line 538 which is labeled TRAP and serves as a trap input to microprocessor 94 (FIG. 8A). Line 536 is directed to a second timing circuit 540 which serves to invert the signal thereat and the output of which is provided at line 542 incorporating a timing resistor 544, the latter of which is coupled to timing capacitor 546 and diode 550. Resistor 544 and capacitor 546 provide a delay network, the output of which is present at line 548 as an active low reset signal which is developed approximately 200 microseconds after the TRAP signal is evolved at line 538. Line 548 is directed to the corresponding reset input of microprocessor 94 as shown in FIG. 8A. The reset signal serves to cause microprocessor 94 to acquire address zero to commence the program at its initial position. Diode 550 is present for the purpose of providing a rapid discharge of capacitor 546 in the event the +5 v source is diminishing.

In FIG. 10A, line 448 is shown coupled to line 500 carrying the +5 v voltage source. As shown in FIG. 10B, this line incorporates a diode 554, the cathode side of which is connected through a resistor 556, one side of which leads through line 560 to capacitor 558. A diode 562 is connected from the union of resistor 556 and capacitor 558 to line 448. Capacitor 558 serves as a temporary power source in the event of power loss for assuring an appropriate +5 v RAM input voltage for an interval sufficient to power RAMS 442 and 443 to complete a write or read operation.

FIG. 10B also reveals an exemplary relay configuration which, for example, may be utilized as trip relay 126 or warning relay 128. The relay itself as at 560 is a four pole double throw type, one pole of which is configured incorporating a monitoring feature. Relay 560 is activated by energization of winding 562 from the labeled 24 v power input upon line 564 assuming a low state. A contact line 566 is coupled to one contact of relay 560 and is connected through pullup resistor 568 to +5 v supply. Accordingly, the signal at line 566 will be high or low depending upon the orientation of 560 to provide a status signal. This signal is asserted, depending upon the function of the relay involved, to port C of network 112 (FIG. 8B).

FIG. 10B also reveals the system fault relay described earlier at 142. The single pole double throw relay is revealed at 570 and includes an energizable winding 572 coupled to +24 v voltage source as well as connected to line 406. Line 406, in turn, assumes an active low condition in consequence of the activation of the Darlington coupled driver transistors within boundary 400 as described in FIG. 8D.

Figure 11:
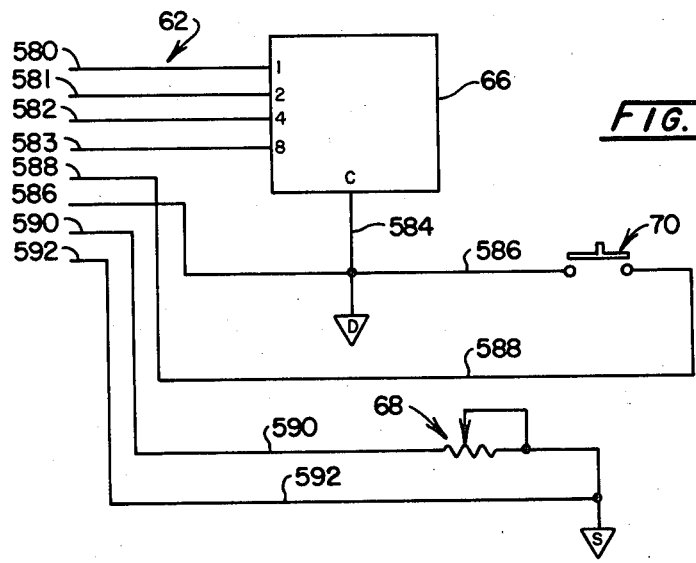
FIG. 11 is a diagram of the circuit utilized in conjunction with a hand-held programmer of the invention.

Referring to FIGS. 11, 8B and 1, the quite simple structure of hand-held programmer 60 is revealed. In FIG. 11, function switch 66 is shown to comprise a binary coded rotary switch having a binary coded condition output at lines 580-583. The C terminal of switch 66 is coupled by line 584 to line 586 which, in turn, is coupled to digital ground in consequence of its representing a component of cable 62 which is coupled through connector 50 to digital ground within apparatus 10. Line 586 also includes the momentary enter switch 70, which switch, additionally, is coupled to connector 50 through line 588. Similarly, programming component 68 is shown as a 10K single turn potentiometer which is connected into connector 50 through cable 62 via leads 590 and 592. Line 590 is connected with line 90 through connector 50, while line 592 is connected to signal ground through the same connector and cable 62.

Figure 12:
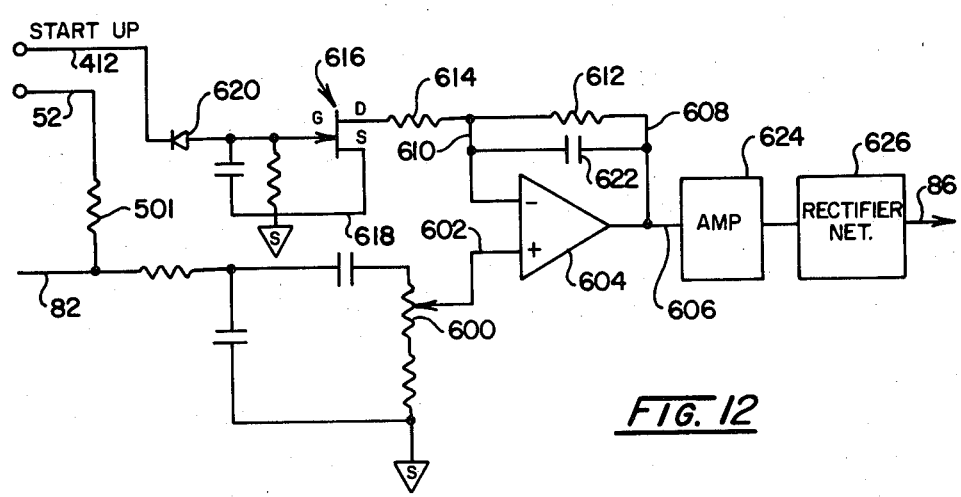
FIG. 12 is a schematic diagram of a typical circuit utilized in signal conditioning.

Referring to FIG. 12, a typical structure for signal conditioning networks 84a-84f is revealed particularly with respect to such networks which are responsive to the start-up signal applied from line 412 (FIG. 8D). The output from the transducer coupled therewith is represented in FIG. 12 at line 82, representing any of the monitored channels. From line 82, the a.c. signal is directed to a potentiometer 600 at which position it is calibrated, the wiper arm of which is coupled through line 602 to the positive input of an operational amplification stage 604. The output of amplification stage 604 at line 606 is coupled with a feedback path including line 608 and line 610. Line 608 includes resistors 612 and 614 and is coupled to the drain, D, terminal of an FET transistor 616. The source terminal, S, of transistor 616 is coupled to signal ground through line 618, while the gate thereof, G, is coupled through diode 620 to the start-up bus or lead 412 described in connection with FIG. 8D. With the arrangement, FET 616 is normally in a conducting state and amplification stage 604 will, therefore, have a gain of 1 plus the value of resistance 612 divided by the resistance of resistor 614. For the instant embodiment, the values will be chosen to provide a gain of 3. With the presence of a start-up signal, however, transistor 410 is turned off and −15 v is asserted at line 412 to turn off FET 616. The gain of amplification 604 then becomes unity inasmuch as the feedback is entirely applied to the negative input thereof instead of being divided by resistor 614. Such a unity gain, in effect, suppresses the signal asserted from the monitoring transducer at line 82. A capacitor 622 is incorporated across the feedback path of amplification stage 604 to roll off its higher frequency response to avoid signals which are outside of the range of interest of the system. Output line 606 is directed through an amplification stage represented at block 624, and the output thereof is directed to a rectifier network 626, the output of which is presented to line 86. It may be recalled that the numeral 86 is used to generally designate the outputs of networks 84a-84f.

Since certain changes may be made in the above-described system and apparatus without departing from the scope of the invention herein, it is intended that all matter contained in the description thereof or shown in the accompanying drawings shall be interpreted as illustrative and not in a limiting sense.

We claim:

1. In a system for monitoring the performance of operational devices through the use of transducers associated therewith, each said transducer having an output corresponding with a select performance parameter, the improvement comprising:

monitoring apparatus including:
a linear array of indicators, each discretely energizable in response to an input signal;
scale means including linearly disposed graduation indicia aligned generally in parallel with and adjacent to said linear array of indicators for providing a scale level correspondence with each said indicator;
signal testing means responsive to said transducer output for deriving a data signal;
processor means responsive to said data signal and including memory means for retaining a limit datum corresponding with a threshold level selected in association with said select performance parameter for deriving a control output;
decoder means responsive to said control output for deriving a first said input signal for energizing a first said indicator adjacent a said scale means indicia having a graduation value corresponding with a said data signal deriving from said transducer output, and simultaneously deriving a second said input signal for energizing a second said indicator adjacent a said scale means indicia having a graduation value corresponding with a said limit datum;
a hand manipular programming component connected in signal transfer relationship with said processor means, actuable to derive output conditions corresponding with a selected said limit datum; and
said processor means is responsive to said hand manipular programming component output conditions to effect a said decoder means energization of a said indicator in correspondence therewith.

2. The system of claim 1 in which said processor means is configured for deriving a said control output corresponding with a said limit datum on an intermittent basis to effect a flashing of a said second indicator.

3. The system of claim 1 in which said scale means graduation indicia are regularly spaced and arranged to represent an aliquot division of a range of values extending between first and second levels.

4. The system of claim 3 in which said graduation indicia are arranged to represent a percentage scale having a range of 0 to 100.

5. The improved apparatus of claim 1 further including:
visible limit indicator means energizable for providing a visible indication of a condition wherein a said threshhold level is at least equalled;
a manually actuable acknowledge switch; and
said processor means is configured for effecting the intermittent energization of said visible limit indicator means by said decoder means upon the development of a said equality and is responsive to a said actuation of said acknowledge switch and the continued presence of said equality to effect a steady state energization of said visible limit indicator means.

6. The system of claim 1 in which:
said programmer further comprises enter switch means connected in signal transfer relationship with said processor means and actuable to assume an enter condition; and
said processor means is responsive to a said programming component output condition in the presence of said enter condition for submitting a corresponding said limit datum to said memory means.

7. The system of claim 6 in which:
said programmer further comprises hand manipular function switch means connected in signal transfer relationship with said processor means and having a plurality of selectable positions, each defining a unique coded function output condition; and
said processor means is responsive to said coded function output condition for submitting said limit datum to said memory means at a predetermined situs corresponding with said function in the presence of said enter condition.

8. The system of claim 7 in which:
said hand manipular function switch means is configured having a delay categorized said position which corresponds with a said function representing a time delay within a predetermined range thereof; and
said processor means is responsive to said coded function output condition corresponding with said delay categorized position and to a said hand manipular programming component output condition to effect a said decoder means energization of a said indicator in correspondence with the instantaneous position of said programming component.

9. The system of claim 8 wherein said processor means is responsive to said coded function output condition corresponding with said delay categorized position and to said hand manipular programming component output condition in the presence of said enter condition for submitting a corresponding datum signal to said memory means.

10. The system of claim 7 further including
suppressor means actuable to effect the select suppression of the level of a said transducer output;
start-up detector means having an output condition in response to the commencement of energization of a said operational device;
a start-up time categorized position of said hand manipular switch means corresponding with a said function representing a time interval within a predetermined range thereof; and
said processor means is responsive to said coded function output condition corresponding with said start-up time categorized position and to a said hand manipular programming component output condition to effect a said decoder means energization of a said indicator in correspondence with the instantaneous position of said programming component.

11. The system of claim 10 wherein said processor means is responsive to said coded function output condition corresponding with said start-up time categorized position and to said hand manipular programming component output condition in the presence of said enter condition for submitting a corresponding datum signal to said memory means.

12. The system of claim 11 further including visible start-up indicator means energizable for providing a visible indication of a condition wherein said suppressor means is actuated; and
said processor means is configured for effecting said start-up indicator means energization for a time interval represented by said hand manipular programming component output condition.

13. The system of claim 6 in which:
said monitoring apparatus includes externally disposed connector means for effecting a signal transfer relationship with said processor means and said signal treating means;
said programmer is portable and includes means defining a signal coupling device for removable insertion in signal transfer relationship with said externally disposed connector means; and
said hand manipular component is coupled with said processor means and said signal treating means through said means defining a signal coupling device.

14. The system of claim 13 in which
said signal treating means includes an analog to digital converter responsive to said transducer output for deriving said data signal in digital form having a value corresponding with the level of said transducer output; and
said portable programmer hand manipular programming component is provided as a potentiometer actuable to effect the assertion of select signal levels from said means defining a signal coupling device at said analog to digital converter.

15. The system of claim 14 wherein
said signal treating means is operatively associated with a source of electrical power; and
said potentiometer is connectable with said source through said means defining a signal coupling device.

16. In a system for monitoring the operation of devices through the use of transducers associated therewith, each said transducer having an output corresponding with a select parameter, the improvement comprising:
monitoring apparatus comprising:
an array of indicators, each discretely energizable;
scale means including graduation indicia aligned generally adjacent to said array of indicators for providing a scale level correspondence with each said indicator;

input means for providing a plurality of channels, each channel uniquely responsive to receive a select said transducer output;

signal treating means coupled with said input means channels and responsive to said transducer outputs for deriving data signals;

channel identification means responsive to a control input for providing a visual indication of a said channel;

hold switch means manually acutable to provide a hold signal;

first limit indicator means energizable for providing a perceptible indication of a condition warranting operator cognizance;

processor means responsive to discrete ones of said data signals for a predetermined dwell interval in a continually recurring predetermined scanning sequence and including memory means for retaining limit data corresponding with threshold levels selected for each said channel in association with a corresponding said select parameter, for retaining control data, for carrying out comparisons of each said data signal with corresponding said limit data, and for deriving control outputs, responsive to a said hold signal occurring during a said dwell interval wherein a said visual indication is provided for a given said channel for effecting continuing response to said data signals corresponding with said given channel; and decoder means responsive to said control outputs for energizing a first said indicator adjacent a said scale means indicia having a graduation value corresponding with a said data signal deriving from a predetermined said input means channel and, simultaneously, energizing a second said indicator adjacent a scale means indicia having a graduation value corresponding with said limit data for said predetermined channel, and, simultaneously, deriving said control input to effect said provision of visual identification of said predetermined channel for effecting the energization of said first limit indicator means in the presence of a said control output representing a condition wherein a said threshold level for one of a predetermined member of said channels is at least equalled.

17. The system of claim 16 in which said processor means is configured for deriving a said control output corresponding with said limit data on an intermittent basis to effect a flashing of said second indicator.

18. The system of claim 16 in which said scale means graduation indicia are regularly spaced and arranged to represent an aliquot division of a range of values extending between first and second levels.

19. The system of claim 18 in which said graduation indicia are arranged to represent a percentage scale having a numerical range of 1 to 100.

20. The system of claim 16 in which:
said first visible limit indicator means is energizable for providing a visible indication of a condition wherein a said threshold level for one of a predetermined number of said channels is at least equalled;

said monitoring apparatus further includes second visible limit indicator means energizable for providing a visible indication of a condition wherein a threshold level for a specific said channel identified at said channel identification means is at least equalled;

a manually actuable acknowledge switch; and said processor means is configured for effecting the intermittent energization of said first visible limit indicator means through said decoder means upon the development of any said equality, for effecting the energization of said second visible limit indicator means through said decoder means for said predetermined dwell interval when the identified said channel at which said threshold level is at least equalled is identified at said channel identification means, said processor means being responsive to a said actuation of said acknowledge switch in the continued presence of said equality at said identified channel and simultaneous said identification of said identified channel to effect a steady state energization of said first visible limit indicator means.

21. The system of claim 20 in which said processor means is configured for effecting the intermittent derivation of said control input by said decoder means when said channel identification means provides a visual indication of a said identified channel which identifies a said equality developed initially in a series of at least two said equalities.

22. The system of claim 21 wherein said processor means is configured for effecting said intermittent derivation of said control input at an intermitting rate selected as greater than the said intermittent energization of said first visible limit indicator means.

23. The system of claim 20 wherein said processor means is configured for effecting an intermittent said energization of said second visible limit indicator means.

24. The system of claim 16 in which:
said monitoring apparatus includes externally disposed connector means for effecting a signal transfer relationship with said processor means and said signal treating means;

said system further including a portable programmer comprising:

means defining a signal coupling device for removable insertion in signal transfer relationship with said externally disposed connector means, a hand manipular programming component connected with said means defining a signal coupling device and movable to derive corresponding output conditions; and said processor means is responsive to said hand manipular programming component output conditions to effect a said decoder means energization of a said indicator in correspondence therewith.

25. The system of claim 24 in which said portable programmer further comprises enter switch means connected with said means defining a signal coupling device and actuable to assume an enter condition; and said processor means is responsive to a said programming component output condition in the presence of a said enter condition for submitting corresponding said data to said memory means in correspondence with said channel identification means visual channel indication.

26. The system of claim 25 in which said portable programmer further comprises hand manipular function switch means connected with said means defining a signal coupling device and having a plurality of selectable positions, each defining a unique coded output function; and said processor means is responsive to said coded function output condition for submitting corresponding said data to said memory means at a predetermined situs corresponding with said function in the presence of said enter condition.

27. The system of claim 26 in which:
said hand manipular function switch means is configured having a delay categorized said position which corresponds with a said function representing a time delay within a predetermined range thereof for delaying the said actuation of said limit response means; and
said processor means is responsive to said coded function output condition corresponding with said delay categorized position and to a said hand manipular programming component output condition to effect a said decoder means energization of a said indicator in correspondence with the instantaneous position of said programming component.

28. The system of claim 27 wherein said processor means is responsive to said coded function output condition corresponding with said delay categorized position and to said hand manipular programming component output condition in the presence of said enter condition for submitting corresponding control data to said memory means.

29. The system of claim 26 further including
suppressor means actuable to effect the select suppression of the level of a said transducer output;
start-up detector means having an output condition in response to the commencement of energization of a said operation of a said device;
a start-up time categorized position of said hand manipular switch means corresponding with a said function representing a time interval within a predetermined maximum range thereof; and
said processor means is responsive to said coded function output condition corresponding with said start-up time categorized position and to a said hand manipular programming component output condition to effect a said decoder means energization of a said indicator in correspondence with the instantaneous position of said programming component.

30. The system of claim 29 wherein said processor means is responsive to said coded function output condition corresponding with said start-up time categorized position and to said hand manipular programming component output condition in the presence of said enter condition for submitting corresponding said control data to said memory means.

31. The system of claim 30 further including visible start-up indicator means energizable for providing a visible indication of a condition wherein said suppressor means is actuated; and
said processor means is configured for effecting said start-up indicator means energization for a time interval represented by said hand manipular programming component output condition.

32. The system of claim 26 in which
said signal treating means includes an analog to digital converter responsive to said transducer output for deriving each said data signal in digital form having a value corresponding with the level of a corresponding said transducer output; and
said portable programmer hand manipular programming component is provided as a potentiometer actuable to effect the assertion of select signal levels from said means defining a signal coupling device at said analog to digital converter.

33. The system of claim 32 wherein
said signal treating means is operatively associated with a source of electrical power;
and said potentiometer is connectable with said source through said means defining a signal coupling device.

34. In a system for monitoring the operation of devices through the use of transducers associated therewith, each said transducer having an output corresponding with a select parameter, the improvement comprising
monitoring apparatus comprising
an array of discretely energizable indicators;
scale means including graduation indicia aligned adjacent to said array of indicators for providing a scale level correspondence with each said indicator;
input means for providing a plurality of channels, each channel uniquely responsive to receive a select said transducer output;
signal treating means including an analog to digital converter coupled with said input means channels and responsive to said transducer output for deriving digitalized data signals;
channel identification means responsive to a control input for providing a visual indication of said channel;
processor means responsive to discrete ones of said data signals in a predetermined scanning sequence and including memory means for retaining limit data corresponding with threshhold levels selected for each said channel in association with a corresponding said select parameter, for retaining control data, for carrying out comparisons of each said data signal with corresponding said limit data, and for deriving contol output;
decoder means responsive to said control outputs for energizing a first said indicator adjacent said scale means indicia having a graduation value corresponding with a said data signal deriving from a predetermined said input means channel and, simultaneously, energizing a second said indicator adjacent a scale means indicia having a graduation value corresponding with said limit data for said predetermined channel and, simultaneously, deriving said control input to effect said provision of visual identification of said predetermined channel; and
connecting means for effecting a signal transfer relationship with said processor means and said signal treating means; and
a portable programmer comprising
means defining a signaling coupling device for removable insertion in signal transfer relationship with said connector means;
a hand manipular programming component connected with said means defining a signal coupling device and movable between limiting positions to derive corresponding output conditions for presentation through said signal coupling device to said signal treating means;
enter switch means connected with said means defining a signal coupling device and actuable to assume an enter condition;
hand manipular function switch means connected with said means defining a signal coupling device and having a plurality of selectable positions, each defining a unique coded output function; and said processor means is responsive to said hand manipular programming component output condition to effect a said decoder means energization of a said indicator in correspondence therewith, is responsive to said coded function output condition for submitting corresponding said data to said memory means at a predetermined situs corresponding with said function in the presence of said enter condition and is responsive to a said programming component output condition in the presence of a said enter condition for submitting corresponding said data to said memory means in correspondence with said channel identification means visual channel indication.

* * * * *